US010897227B2

(12) United States Patent
Yamamoto

(10) Patent No.: US 10,897,227 B2
(45) Date of Patent: Jan. 19, 2021

(54) OSCILLATION CIRCUIT, OSCILLATOR, ELECTRONIC DEVICE, AND VEHICLE

(71) Applicant: SEIKO EPSON CORPORATION, Tokyo (JP)

(72) Inventor: Takehiro Yamamoto, Matsumoto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 16/773,572

(22) Filed: Jan. 27, 2020

(65) Prior Publication Data

US 2020/0244223 A1 Jul. 30, 2020

(30) Foreign Application Priority Data

Jan. 29, 2019 (JP) ................... 2019-013423

(51) Int. Cl.
*H03B 5/04* (2006.01)
*H03B 5/36* (2006.01)

(52) U.S. Cl.
CPC ............ *H03B 5/364* (2013.01); *H03B 5/362* (2013.01); *H03B 5/368* (2013.01); *H03B 5/04* (2013.01)

(58) Field of Classification Search
CPC ... H03B 5/04; H03B 5/30; H03B 5/32; H03B 5/36; H03B 5/362; H03B 5/364; H03B 5/366; H03B 5/368
See application file for complete search history.

(56) References Cited

U.S. PATENT DOCUMENTS

| 5,150,079 | A | * | 9/1992 | Williams | ............... | H03B 5/364 |
| | | | | | | 331/116 FE |
| 5,453,719 | A | * | 9/1995 | Narahara | ............... | H03B 5/364 |
| | | | | | | 331/49 |
| 6,097,257 | A | * | 8/2000 | Kadowaki | ................. | G04F 5/06 |
| | | | | | | 331/116 FE |
| 9,000,852 | B1 | * | 4/2015 | Sinitsky | ................. | H03B 5/362 |
| | | | | | | 331/116 R |
| 2009/0231049 | A1 | | 9/2009 | Kikuchi et al. | | |
| 2010/0188157 | A1 | * | 7/2010 | Kondo | .................... | G06F 1/324 |
| | | | | | | 331/46 |
| 2013/0257550 | A1 | | 10/2013 | Ishikawa et al. | | |
| 2015/0116043 | A1 | | 4/2015 | Itasaka et al. | | |
| 2015/0116044 | A1 | | 4/2015 | Itasaka et al. | | |

(Continued)

FOREIGN PATENT DOCUMENTS

| JP | 2009-225123 A | 10/2009 |
| JP | 2013-207363 A | 10/2013 |

(Continued)

*Primary Examiner* — Levi Gannon
(74) *Attorney, Agent, or Firm* — Rankin, Hill & Clark LLP

(57) ABSTRACT

An oscillation circuit includes a first node, a first switching element, and a second switching element and has a first mode in which the first switching element does not electrically couple the first external connection terminal and the first node and the second switching element does not electrically couple the first node and the second external connection terminal which is electrically coupled to one end of a resonator and a second mode in which the first switching element electrically couples the first external connection terminal and the first node and the second switching element electrically couples the first node and the second external connection terminal, and in the first mode, a voltage of the first node is fixed.

16 Claims, 11 Drawing Sheets

(56) References Cited

U.S. PATENT DOCUMENTS

| | | | |
|---|---|---|---|
| 2015/0116045 A1 | 4/2015 | Itasaka et al. | |
| 2015/0116048 A1 | 4/2015 | Yamamoto et al. | |
| 2015/0123743 A1* | 5/2015 | Kiyohara | H03B 5/368 331/36 C |
| 2015/0130547 A1 | 5/2015 | Ishikawa et al. | |
| 2017/0346442 A1* | 11/2017 | Ito | H03B 5/364 |
| 2019/0007012 A1* | 1/2019 | Marques | H03B 5/364 |

FOREIGN PATENT DOCUMENTS

| | | |
|---|---|---|
| JP | 2015-088924 A | 5/2015 |
| JP | 2015-088925 A | 5/2015 |
| JP | 2015-088930 A | 5/2015 |
| JP | 2015-088931 A | 5/2015 |
| JP | 2015-095709 A | 5/2015 |
| JP | 2015-177259 A | 10/2015 |
| JP | 2017-225056 A | 12/2017 |
| JP | 2018-152916 A | 9/2018 |

* cited by examiner ically coupled and a second mode in which one end of
OSCILLATION CIRCUIT, OSCILLATOR, ELECTRONIC DEVICE, AND VEHICLE The present application is based on, and claims priority from JP Application Serial Number 2019-013423, filed Jan. 29, 2019, the disclosure of which is hereby incorporated by reference herein in its entirety.

BACKGROUND

1. Technical Field

The present disclosure relates to an oscillation circuit, an oscillator, an electronic device, and a vehicle.

2. Related Art

In JP-A-2015-88930, an oscillator that includes a metal oxide semiconductor (MOS) transistor for switching between a first mode in which one end of a resonator and an external connection terminal of an oscillation circuit are electrically coupled and a second mode in which one end of the resonator and the external connection terminal of the oscillation circuit are not electrically coupled is described. According to the oscillator described in JP-A-2015-88930, even if the oscillator is a small, low-profile, single package oscillator that accommodates the oscillation circuit and the resonator in the same container, by setting the oscillator to the first mode and inputting a desired signal to the external connection terminal of the oscillation circuit, it becomes possible to perform an overdrive inspection and a drive level inspection of the resonator, thereby improving product quality and yield.

However, in the oscillator described in JP-A-2015-88930, for example, when an oscillation signal swings below a ground level or reaches a power supply level in a state of being set to the second mode during a normal operation, the MOS transistor becomes weakly conductive, and the oscillation signal may be leaked to the external connection terminal of the oscillation circuit. Since an amount of the oscillation signal leakage varies according to a voltage level of the external connection terminal, an oscillation frequency may not be stable.

SUMMARY

An oscillation circuit according to an aspect of the present disclosure includes a first external connection terminal, a second external connection terminal that is electrically coupled to one end of a resonator, a third external connection terminal that is electrically coupled to the other end of the resonator, an amplification circuit that is electrically coupled to the second external connection terminal and the third external connection terminal, amplifies a signal output from the resonator, and supplies the amplified signal to the resonator, a first node, a first switching element that switches whether or not to electrically couple the first external connection terminal and the first node, and a second switching element that switches whether or not to electrically couple the first node and the second external connection terminal, and having a first mode in which the first switching element does not electrically couple the first external connection terminal and the first node and the second switching element does not electrically couple the first node and the second external connection terminal, and a second mode in which the first switching element electrically couples the first external connection terminal and the first node and the second switching element electrically couples the first node and the second external connection terminal, an in which, in the first mode, a voltage of the first node is fixed.

The oscillation circuit according to the aspect may further include a third switching element that switches whether or not to electrically couple the first external connection terminal and the first node, and a fourth switching element that switches whether or not to electrically couple the first node and the second external connection terminal, and in which, in the first mode, the third switching element may not electrically couple first external connection terminal and the first node and the fourth switching element may not electrically couple the first node and the second external connection terminal, in the second mode, the third switching element may electrically couple the first external connection terminal and the first node and the fourth switching element may electrically couple the first node and the second external connection terminal, each of the first switching element and the second switching element may be an N-channel MOS switch, and each of the third switching element and the fourth switching element may be a P-channel MOS switch.

The oscillation circuit according to the aspect may further include a third switching element that switches whether or not to electrically couple the first external connection terminal and the second external connection terminal, and in which in the first mode, the third switching element may not electrically couple the first external connection terminal and the second external connection terminal, in the second mode, the third switching element may electrically couple the first external connection terminal and the second external connection terminal, each of the first switching element and the second switching element may be an N-channel MOS switch, and the third switching element may be a P-channel MOS switch.

The oscillation circuit according to the aspect may further include a fourth external connection terminal to which a first power supply voltage is supplied, a fifth external connection terminal to which a second power supply voltage higher than the first power supply voltage is supplied, and a fifth switching element that switches whether or not to electrically couple the first node and the fourth external connection terminal, and in which in the first mode, the fifth switching element may electrically couple the first node and the fourth external connection terminal, in the second mode, the fifth switching element may not electrically couple the first node and the fourth external connection terminal, and the fifth switching element may be an N-channel MOS switch.

The oscillation circuit according to the aspect may further include a sixth switching element that switches whether or not to electrically couple the fourth external connection terminal and the third external connection terminal, and in which, in the first mode, the sixth switching element may not electrically couple the fourth external connection terminal and the third external connection terminal, and in the second mode, the sixth switching element may electrically couple the fourth external connection terminal and the third external connection terminal.

The oscillation circuit according to the aspect may further include a third switching element that switches whether or not to electrically couple the first external connection terminal and the second external connection terminal, and in which, in the first mode, the third switching element may not electrically couple the first external connection terminal and the second external connection terminal, in the second mode, the third switching element may electrically couple the first external connection terminal and the second external connection terminal, each of the first switching element and the second switching element may be a P-channel MOS switch, and the third switching element may be an N-channel MOS switch.

The oscillation circuit according to the aspect may further include a fourth external connection terminal to which a first power supply voltage is supplied, a fifth external connection terminal to which a second power supply voltage higher than the first power supply voltage is supplied, and a fourth switching element that switches whether or not to electrically couple the first node and the fifth external connection terminal, and in which, in the first mode, the fourth switching element may electrically couple the first node and the fifth external connection terminal, in the second mode, the fourth switching element may not electrically couple the first node and the fifth external connection terminal, and the fourth switching element may be a P-channel MOS switch.

The oscillation circuit according to the aspect may further include a fifth switching element that switches whether or not to electrically couple the fourth external connection terminal and the third external connection terminal, and in which, in the first mode, the fifth switching element may not electrically couple the fourth external connection terminal and the third external connection terminal, and in the second mode, the fifth switching element may electrically couple the fourth external connection terminal and the third external connection terminal.

In the oscillation circuit according to the aspect, in the first mode, the amplification circuit may perform an amplification operation for amplifying a signal output from the resonator, and in the second mode, the amplification circuit may stop the amplification operation.

The oscillation circuit according to the aspect may further include an interface circuit that selects the first mode or the second mode based on a signal input from the outside of the oscillation circuit.

An oscillator according to another aspect of the present disclosure includes the oscillation circuit according to the aspect and the resonator.

An electronic device according to another aspect of the present disclosure includes the oscillator according to the aspect.

A vehicle according to another aspect of the present disclosure includes the oscillator according to the aspect.

DESCRIPTION OF EXEMPLARY EMBODIMENTS

Hereinafter, exemplary embodiments of the present disclosure will be described in detail with reference to the drawings. The embodiments described below do not unduly limit contents of the present disclosure described in the appended claims. Also, not all of the configurations described below are essential constituent requirements of the present disclosure.

1. Oscillator 1-1. First Embodiment

Figure 1:
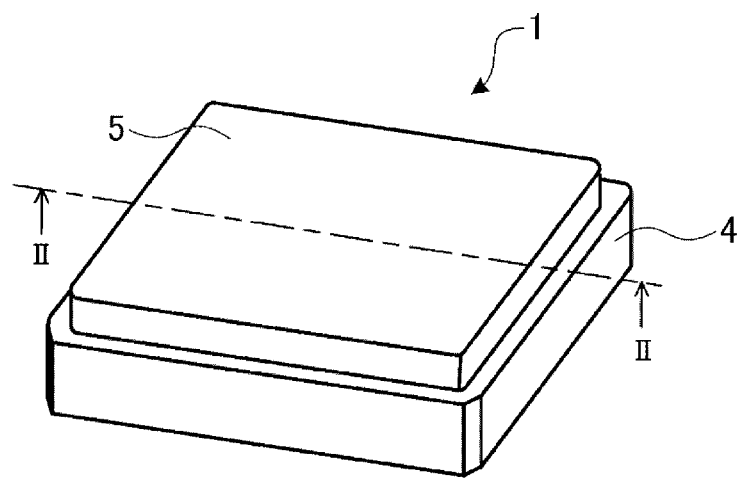
FIG. 1 is a perspective view of an oscillator according to an exemplary embodiment.
Figure 2:
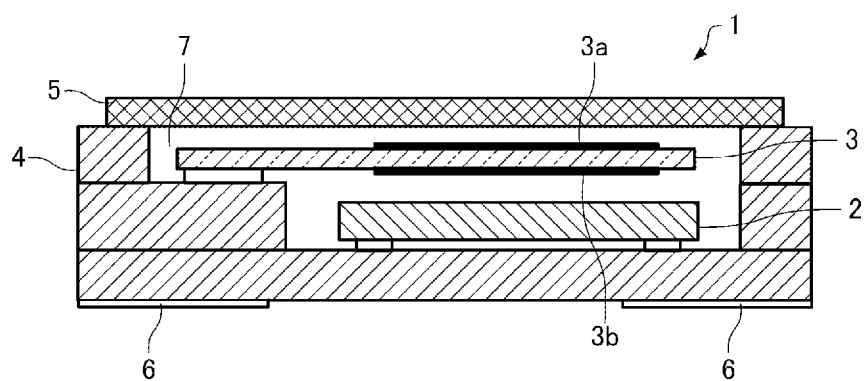
FIG. 2 is cross-sectional view of an oscillator according to the exemplary embodiment.

FIGS. 1 and 2 are diagrams illustrating an example of a structure of an oscillator 1 of the exemplary embodiment. FIG. 1 is a perspective view of the oscillator 1 and FIG. 2 is a cross-sectional view taken along line II-II of FIG. 1.

As illustrated in FIGS. 1 and 2, the oscillator 1 includes an oscillation circuit 2, a resonator 3, a package 4, a lid 5, and a plurality of external terminals 6. In the exemplary embodiment, the resonator 3 is a quartz crystal resonator using quartz crystal as a substrate material, and is, for example, an AT cut quartz crystal resonator, a tuning fork type quartz crystal resonator, or the like. The resonator 3 may be a surface acoustic wave (SAW) resonator or a micro electromechanical systems (MEMS) resonator. As the substrate material of the resonator 3, in addition to quartz crystal, piezoelectric single crystals such as lithium tantalate and lithium niobate, piezoelectric materials such as piezoelectric ceramics such as lead zirconate titanate, or silicon semiconductor materials can be used. As an excitation unit of the resonator 3, one using a piezoelectric effect may be used, or electrostatic drive using a Coulomb force may be used. In the exemplary embodiment, the oscillation circuit 2 is realized by a one-chip integrated circuit (IC). However, at least a part of the oscillation circuit 2 may be composed of discrete components.

The package 4 accommodates the oscillation circuit 2 and the resonator 3 in the same space. Specifically, the package 4 is provided with a recess, and the recess is covered with the lid 5 to form an accommodation chamber 7. On the inside of the package 4 or the surface of the recess, wirings (not illustrated) for electrically coupling two terminals of the oscillation circuit 2, specifically, an XI terminal and an XO terminal in FIG. 3 to be described later, and two excitation electrodes 3a and 3b of the resonator 3, respectively, are provided. On the inside of the package 4 or the surface of the recess, wiring (not illustrated) for electrically coupling each terminal of the oscillation circuit 2 and each external terminal 6 provided on the bottom surface of the package 4 is provided. The package 4 is not limited to a configuration in which the oscillation circuit 2 and the resonator 3 are accommodated in the same space. For example, a so-called H-type package in which the oscillation circuit 2 is mounted on one surface of a package substrate and the resonator 3 is mounted on the other surface thereof may be used.

The resonator 3 includes metal excitation electrodes 3a and 3b on the front and back surfaces thereof, respectively, and oscillates at a desired frequency according to the shape and mass of the resonator 3 including the excitation electrodes 3a and 3b.

Figure 3:
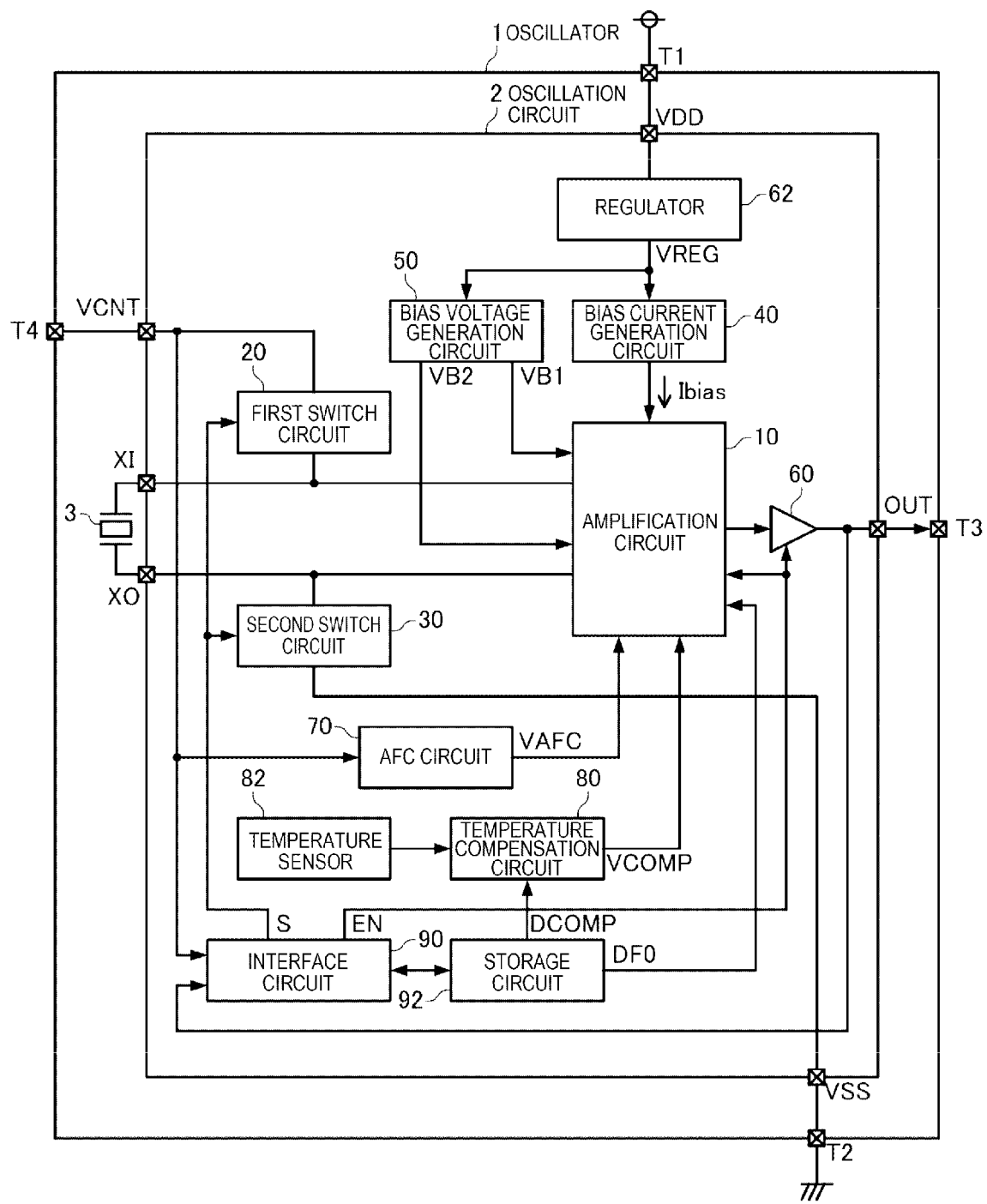
FIG. 3 is a functional block diagram of an oscillator according to a first embodiment.

FIG. 3 is a functional block diagram of the oscillator 1 according to the first embodiment. As illustrated in FIG. 3, the oscillator 1 of the exemplary embodiment includes the oscillation circuit 2 and the resonator 3. The oscillation circuit 2 includes a VDD terminal, a VSS terminal, an OUT terminal, a VCNT terminal, the XI terminal, and the XO terminal as external connection terminals. The VDD terminal, the VSS terminal, the OUT terminal, and the VCNT terminal are electrically coupled to T1 to T4 terminals, which are the plurality of external terminals 6 of the oscillator 1 illustrated in FIG. 2, respectively. The XI terminal is electrically coupled to one end of the resonator 3 and the terminal XO terminal is electrically coupled to the other end of the resonator 3.

In the exemplary embodiment, the oscillation circuit 2 includes an amplification circuit 10, a first switch circuit 20, a second switch circuit 30, a bias current generation circuit 40, a bias voltage generation circuit 50, an output buffer 60, a regulator 62, an automatic frequency control (AFC) circuit 70, a temperature compensation circuit 80, a temperature sensor 82, an interface circuit 90, and a storage circuit 92. The oscillation circuit 2 may have a configuration in which some of these elements are omitted or changed, or other elements are added.

The regulator 62 generates a constant voltage VREG based on a power supply voltage supplied from the outside through the T1 terminal and the VDD terminal, and supplies the constant voltage VREG to the bias current generation circuit 40. For example, the regulator 62 may generate a voltage VREG based on an output voltage of a band gap reference circuit.

The bias current generation circuit 40 generates a bias current Ibias based on the voltage VREG output from the regulator 62 and supplies the bias current Ibias to the amplification circuit 10.

The bias voltage generation circuit 50 generates bias voltages VB1 and VB2 based on the voltage VREG output from the regulator 62, and supplies the bias voltages VB1 and VB2 to the amplification circuit 10.

The amplification circuit 10 is a circuit that is electrically coupled to the XI terminal and the XO terminal, amplifies a signal output from the resonator 3 and supplies the amplified signal to the resonator 3, and causes the resonator 3 to oscillate. The amplification circuit 10 is supplied with the bias current Ibias and the bias voltages VB1 and VB2, and performs an amplification operation for amplifying the signal output from the resonator 3. In the exemplary embodiment, the amplification circuit 10 performs the amplification operation when an enable signal EN is at a high level, and stops the amplification operation when the enable signal EN is at a low level.

An oscillation signal output from the amplification circuit 10 is input to the output buffer 60. An output signal of the output buffer 60 is output to the outside of the oscillator 1 through the OUT terminal and the T3 terminal. In the exemplary embodiment, the output buffer 60 outputs the oscillation signal when the enable signal EN is at a high level, and the output of the output buffer 60 becomes high impedance when the enable signal EN is at a low level. The amplification circuit 10 is adjusted, based on frequency adjustment data DFO, so that an oscillation frequency at reference temperature becomes a target frequency.

The first switch circuit 20 is a circuit for switching whether or not to electrically couple the VCNT terminal and the XI terminal, based on a switch control signal S. In the exemplary embodiment, the first switch circuit 20 electrically couples the VCNT terminal and the XI terminal when the switch control signal S is at a high level, and electrically discouples the VCNT terminal and the XI terminal when the switch control signal S is at a low level.

The second switch circuit 30 is a circuit for switching whether or not to electrically couple the VSS terminal and the XO terminal, based on the switch control signal S. In the exemplary embodiment, the second switch circuit 30 electrically couples the VSS terminal and the XO terminal when the switch control signal S is at the high level, and electrically discouples the VSS terminal and the XO terminal when the switch control signal S is at the low level.

The AFC circuit 70 generates a frequency control voltage VAFC for controlling the oscillation frequency of the amplification circuit 10 according to a voltage level of a frequency control signal input from the T4 terminal and supplied through the VCNT terminal, and supplies the frequency control voltage VAFC to the amplification circuit 10.

The temperature sensor 82 detects temperature of the oscillation circuit 2 and outputs a temperature signal having a voltage corresponding to the temperature and is realized by, for example, a circuit using temperature characteristics of the band gap reference circuit.

The temperature compensation circuit 80 generates a temperature compensation voltage VCOMP for correcting the frequency temperature characteristics of the oscillation signal output from the amplification circuit 10 based on the temperature signal output from the temperature sensor 82 and temperature compensation data DCOMP corresponding to the frequency temperature characteristics of the resonator 3, and supplies the temperature compensation voltage VCOMP to the amplification circuit 10.

The interface circuit 90 receives a serial data signal input from the T3 terminal and supplied through the OUT terminal in synchronization with a serial clock signal input from the T4 terminal and supplied through the VCNT terminal. The interface circuit 90 writes various pieces of information to the storage circuit 92 according to the serial data signal. The interface circuit 90 shifts the oscillator 1 to various operation modes according to the serial data signal. The interface circuit 90 outputs then enable signal EN and the switch control signal S. The enable signal EN and the switch control signal S are set to a low level or a high level, respectively, according to the operation mode of the oscillator 1. In the exemplary embodiment, the interface circuit 90 is, for example, an interface circuit of a two-wire bus such as an inter-integrated circuit ($I^2C$) bus, but may be an interface circuit of a three-wire bus or a four-wire bus such as a serial peripheral interface (SPI) bus.

The storage circuit 92 is a circuit that stores various types of information and includes, for example, a register and a non-volatile memory such as a metal oxide nitride oxide silicon (MONOS) type memory or an electrically erasable programmable read-only memory (EEPROM). In the manufacturing process of the oscillator 1, various pieces of information such as temperature compensation data DCOMP and frequency adjustment data DFO is stored in the non-volatile memory of the storage circuit 92. When power is supplied to the oscillator 1, various pieces of information stored in the non-volatile memory of the storage circuit 92 is transferred to a register, and various pieces of information stored in the register is supplied to each circuit as appropriate.

In the exemplary embodiment, the oscillator 1 operates in a normal operation mode when the power is turned on, and when the operation mode of the oscillator 1 is the normal operation mode, the enable signal EN is set to a high level and the switch control signal S is set to a low level. When the enable signal EN is set to the high level, the amplification circuit 10 performs the amplification operation, the output buffer 60 outputs the oscillation signal, and when the switch control signal S is set to the low level, the VCNT terminal and the XI terminal are electrically discoupled, and the VSS terminal and the XO terminal are electrically discoupled.

When the operation mode of the oscillator 1 is a resonator inspection mode for inspecting the resonator 3, the enable signal EN is set to the low level and the switch control signal S is set to the high level. When the enable signal EN is set to the low level, the amplification circuit 10 stops the amplification operation and the output of the output buffer 60 becomes high impedance, and when the switch control signal S is set to the high level, the VCNT terminal and the XI terminal are electrically coupled and the VSS terminal and the XO terminal are electrically coupled. With this configuration, in the resonator inspection mode, it becomes possible to oscillate the resonator 3 by supplying a signal having a desired amplitude level from the T4 terminal and the T2 terminal to both ends of the resonator 3, and the resonator 3 can be inspected.

Figure 4:
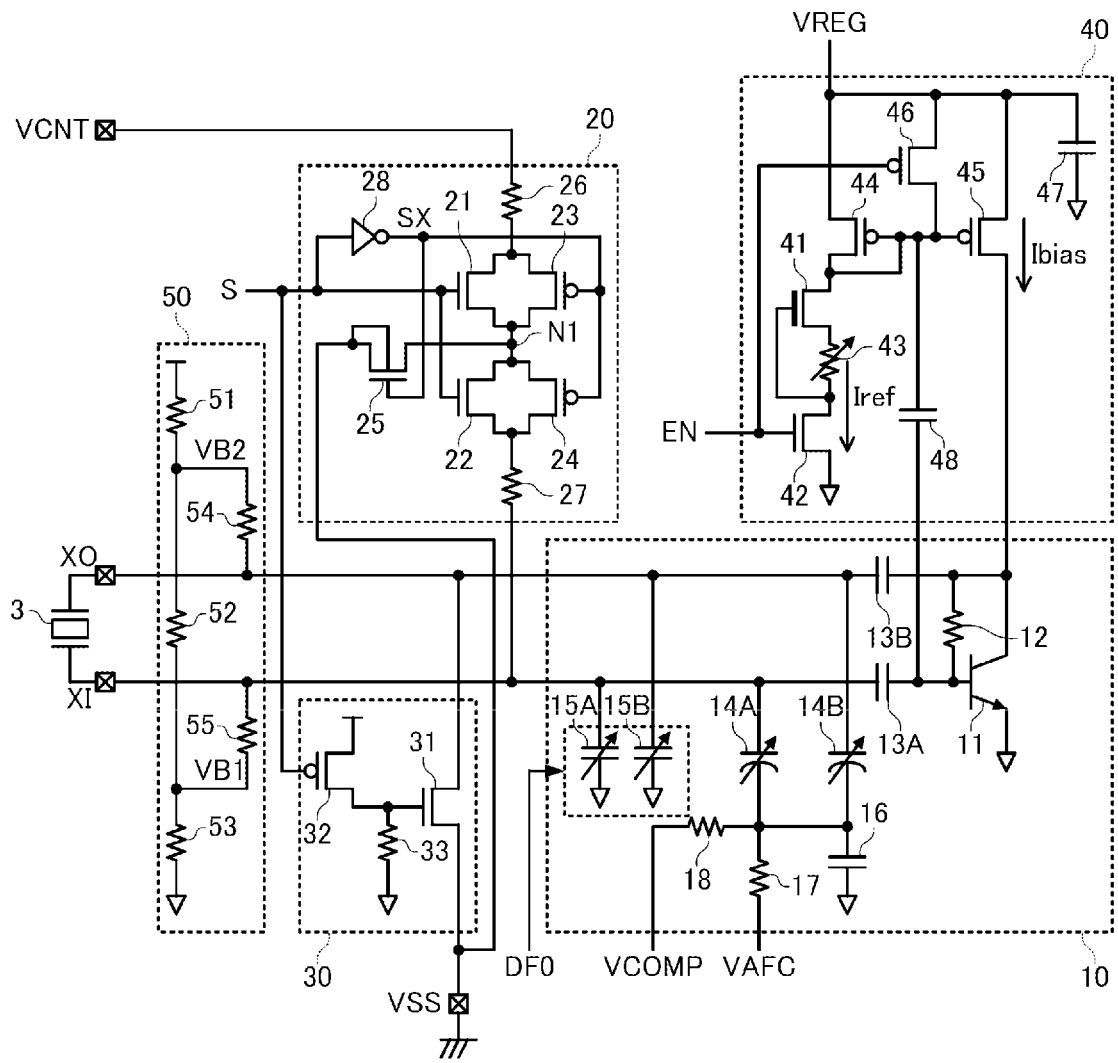
FIG. 4 is a diagram illustrating a specific configuration example of an amplification circuit, a first switch circuit, a second switch circuit, a bias current generation circuit, and a bias voltage generation circuit in the first embodiment.

FIG. 4 is a diagram illustrating a specific configuration example of the amplification circuit 10, the first switch circuit 20, the second switch circuit 30, the bias current generation circuit 40, and the bias voltage generation circuit 50.

In the example of FIG. 4, the bias voltage generation circuit 50 includes resistors 51, 52, 53, and 54. A power supply voltage is supplied to one end of the resistor 51 and the other end thereof is electrically coupled to one end of the resistor 52 and one end of the resistor 54. The other end of the resistor 52 is electrically coupled to one end of the resistor 53 and one end of the resistor 55, and the other end of the resistor 54 is electrically coupled to the XO terminal. The other end of the resistor 53 is grounded, and the other end of the resistor 55 is electrically coupled to the XI terminal.

The bias voltage generation circuit 50 configured as described above generates bias voltages VB1 and VB2 by dividing the voltage between the power supply voltage and the ground voltage by a resistance ratio of the resistors 51, 52, and 53 and supplies the bias voltages VB1 and VB2 to the amplification circuit 10 through the resistors 54 and 55. The bias voltage VB1 is lower than the bias voltage VB2.

The bias current generation circuit 40 includes NMOS transistors 41 and 42, a variable resistor 43, PMOS transistors 44, 45, and 46, and capacitors 47 and 48. The NMOS transistor 41 is a depletion type NMOS transistor, a gate thereof is electrically coupled to one end of the variable resistor 43, a source thereof is electrically coupled to the other end of the variable resistor 43, and a drain thereof is electrically coupled to a drain of the PMOS transistor. The enable signal EN is input to the gate of the NMOS transistor 42, the source thereof is grounded, and the drain thereof is electrically coupled to a gate of the NMOS transistor 41 and the other end of the variable resistor 43. A gate and a drain of the PMOS transistor 44 are electrically coupled, and a voltage VREG is supplied to a source thereof. A gate of the PMOS transistor 45 is electrically coupled to the gate of the PMOS transistor 44, a voltage VREG is supplied to the source of the PMOS transistor 45, and a drain thereof is electrically coupled to a collector of a bipolar transistor 11 of the amplification circuit 10. The enable signal EN is input to a gate of the PMOS transistor 46, the voltage VREG is supplied to a source thereof, and a drain thereof is electrically coupled to the gate of the PMOS transistor 44 and the gate of the PMOS transistor 45. The voltage VREG is supplied to one end of the capacitor 47 and the other end thereof is grounded. One end of the capacitor 48 is electrically coupled to the gate of the PMOS transistor 44 and the gate of the PMOS transistor 45, and the other end thereof is electrically coupled to a base of the bipolar transistor 11.

In the bias current generation circuit 40 configured in this way, when the enable signal EN is at a high level, a current obtained by multiplying a reference current Iref flowing through the NMOS transistors 41 and 42 by a predetermined value by a current mirror circuit composed of the PMOS transistors 44 and 45 flows between the source and drain of the PMOS transistor 45. This current is supplied to the amplification circuit 10 as a bias current Ibias. A magnitude of the reference current Iref changes according to a resistance value of the variable resistor 43, and the resistance value of the variable resistor 43 is adjusted according to data stored in the storage circuit 92 so that the reference current Iref has a desired magnitude.

The amplification circuit 10 includes the NPN bipolar transistor 11, resistors 12, 17, and 18, capacitors 13A, 13B, and 16, variable capacitance elements 14A and 14B such as varactors, and capacitor banks 15A and 15B. The base of the bipolar transistor 11 is electrically coupled to one end of the capacitor 13A and one end of the resistor 12, the collector thereof is electrically coupled to one end of the capacitor 13B and the other end of the resistor 12, and an emitter thereof is grounded. The other end of the capacitor 13A is electrically coupled to the XI terminal, and the other end of the capacitor 13B is electrically coupled to the XO terminal. The bias current Ibias is supplied to the collector of the bipolar transistor 11. One end of the variable capacitance element 14A is electrically coupled to the XI terminal, and the other end thereof is electrically coupled to one end of the capacitor 16, one end of the resistor 17, and one end of the resistor 18. One end of the variable capacitance element 14B is electrically coupled to the XO terminal, and the other end thereof is electrically coupled to one end of the capacitor 16, one end of the resistor 17, and one end of the resistor 18. The other end of the capacitor 16 is grounded, the frequency control voltage VAFC is supplied to the other end of the resistor 17, and the temperature compensation voltage VCOMP is supplied to the other end of the resistor 18. The variable capacitance elements 14A and 14B serve as load capacitance of the resonator 3, and the capacitance values thereof change according to the magnitude of the frequency control voltage VAFC and the magnitude of the temperature compensation voltage VCOMP. The capacitor bank 15A is coupled between the XI terminal and the ground, and the capacitor bank 15B is coupled between the XO terminal and the ground. The capacitor banks 15A and 15B serve as the load capacity of the resonator 3, and the capacity values thereof change according to the frequency adjustment data DFO.

In the amplification circuit 10 configured in this way, the bipolar transistor 11 amplifies an output signal of the resonator 3 input from the XI terminal by the bias current Ibias supplied to the collector and the amplified signal is supplied to the resonator 3 through the XO terminal. A signal generated at the XI terminal is an oscillation signal based on the bias voltage VB1 and a signal generated at the XO terminal is an oscillation signal based on the bias voltage VB2. Since the bias voltage VB1 is lower than the bias voltage VB2, the oscillation signal generated at the XI terminal has a lower voltage level than the oscillation signal generated at the XO terminal. The variable capacitance elements 14A and 14B and the capacitor banks 15A and 15B serve as load capacitances of the resonator 3, respectively, and the frequency of the oscillation signal changes according to each capacitance value. The oscillation signal generated at the collector of the bipolar transistor 11 becomes the output signal of the amplification circuit 10, and is supplied to the output buffer 60 illustrated in FIG. 3.

The first switch circuit 20 includes NMOS transistors 21, 22, and 25, PMOS transistors 23 and 24, resistors 26 and 27, and an inverter circuit 28.

The inverter circuit 28 receives the switch control signal S as an input and outputs a switch control signal SX with its logic inverted.

The NMOS transistor 21 is a switching element that switches whether or not to electrically couple the VCNT terminal and the node N1. Similarly, the PMOS transistor 23 is a switching element that switches whether or not to electrically couple the VCNT terminal and the node N1.

The NMOS transistor 22 is a switching element that switches whether or not to electrically couple the node N1 and the XI terminal. Similarly, the PMOS transistor 24 is a switching element that switches whether or not to electrically couple the node N1 and the XI terminal.

The NMOS transistor 25 is a switching element that switches whether or not to electrically couple the node N1 and the VSS terminal.

The switch control signal S is input to the gates of the NMOS transistors 21 and 22, and the switch control signal SX is input to the gates of the PMOS transistors 23 and 24 and the NMOS transistor 25.

The NMOS transistors 21 and 22 are N-channel MOS switches, respectively, and in the NMOS transistors 21 and 22, the source and the drain become conductive when the switch control signal S is at the high level and the source and the drain become non-conductive when the switch control signal S is at the low level. Accordingly, when the switch control signal S is at the low level, it becomes a first mode in which the NMOS transistor 21 does not electrically couple the VCNT terminal and the node N1 and the NMOS transistor 22 does not electrically couple the node N1 and the XI terminal. When the switch control signal S is at the high level, it becomes a second mode in which the NMOS transistor 21 electrically couples the VCNT terminal and the node N1 and the NMOS transistor 22 electrically couples the node N1 and the XI terminal. That is, the oscillation circuit 2 has the first mode and the second mode.

The PMOS transistors 23 and 24 are P-channel MOS switches, respectively, and in the PMOS transistors 23 and 24, the source and the drain become conductive when the switch control signal S is at the high level and the source and the drain become non-conductive when the switch control signal S is at the low level. Accordingly, in the first mode, the PMOS transistor 23 does not electrically couple the VCNT terminal and the node N1, and the PMOS transistor 24 does not electrically couple the node N1 and the XI terminal. In the second mode, the PMOS transistor 23 electrically couples the VCNT terminal and the node N1, and the PMOS transistor 24 electrically couples the node N1 and the XI terminal.

The NMOS transistor 25 is an N-channel MOS switch, and in the NMOS transistor 25, the source and the drain become conductive when the switch control signal S is at the low level and the source and the drain become non-conductive when the switch control signal S is at the high level. Accordingly, in the first mode, the NMOS transistor 25 electrically couples the node N1 and the VSS terminal. As a result, in the first mode, the voltage at the node N1 is fixed to the ground voltage. In the second mode, the NMOS transistor 25 does not electrically couple the node N1 and the VSS terminal. As a result, in the second mode, the voltage at the node N1 is not fixed to the ground voltage.

The second switch circuit 30 includes an NMOS transistor 31, a PMOS transistor 32, and a resistor 33. The switch control signal S is input to a gate of the PMOS transistor 32, a power supply voltage is supplied to a source thereof, and a drain thereof is electrically coupled to a gate of the NMOS transistor 31 and one end of the resistor 33. The other end of the resistor 33 is grounded. When the switch control signal S is at the low level, the source and drain of the PMOS transistor 32 become conductive and the voltage at the gate of the NMOS transistor 31 becomes a high level. When the switch control signal S is at the high level, the source and drain of the PMOS transistor 32 become non-conductive and the voltage at the gate of the NMOS transistor 31 becomes a low level.

The NMOS transistor 31 is a switching element that switches whether or not to electrically couple the VSS terminal and the XO terminal. The NMOS transistor 31 is an N-channel MOS switch, and in the NMOS transistor 31, the source and the drain become conductive when the switch control signal S is at the low level and the source and the drain become non-conductive when the switch control signal S is at the high level. Accordingly, in the first mode, the NMOS transistor 31 does not electrically couple the VSS terminal and the XO terminal. In the second mode, the NMOS transistor 31 electrically couples the VSS terminal and the XO terminal.

Figure 5:
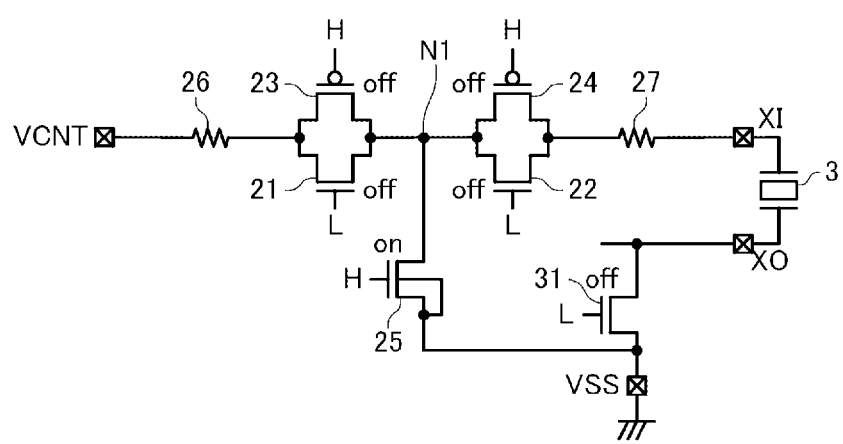
FIG. 5 is a diagram illustrating a conduction/non-conduction state of each NMOS transistor and each PMOS transistor in a first mode in the first embodiment.

As described above, in the exemplary embodiment, when the operation mode of the oscillator 1 is the normal operation mode, the enable signal EN is set to the high level and the switch control signal S is set to the low level. With this configuration, the oscillation circuit 2 is set to the first mode. FIG. 5 is a diagram illustrating a conduction/non-conduction state of the NMOS transistors 21, 22, 25, and 31 and the PMOS transistors 23 and 24 when the oscillation circuit 2 is in the first mode. In FIG. 5, "on" represents conduction, and "off" represents non-conduction.

As illustrated in FIG. 5, in the first mode, all of the NMOS transistors 21, 22, and 31 and the PMOS transistors 23 and 24 become non-conductive. With this configuration, the XI terminal and the VCNT terminal are not electrically coupled and the XO terminal and the VSS terminal are not electrically coupled. Since the enable signal EN is at the high level, in the first mode, the amplification circuit 10 can perform an amplification operation and oscillate the resonator 3. However, when the voltage level of the oscillation signal generated at the XI terminal due to oscillation of the resonator 3 falls below the ground voltage, the NMOS transistor 22 becomes weakly conductive, and when the voltage level of the oscillation signal exceeds the power supply voltage, the PMOS transistor 24 becomes weakly conductive. As a result, although the oscillation signal may leak from the XI terminal to the node N1, in the exemplary embodiment, when the NMOS transistor 25 becomes conductive, the oscillation signal leaks to the ground, but leakage of the oscillation signal to the VCNT terminal is reduced. Furthermore, since the voltage at the node N1 is fixed to the ground voltage, an amount of oscillation signal leaked to the ground is constant, and thus fluctuations in the oscillation frequency due to the voltage at the VCNT terminal are reduced and the oscillation frequency is stabilized.

Figure 6:
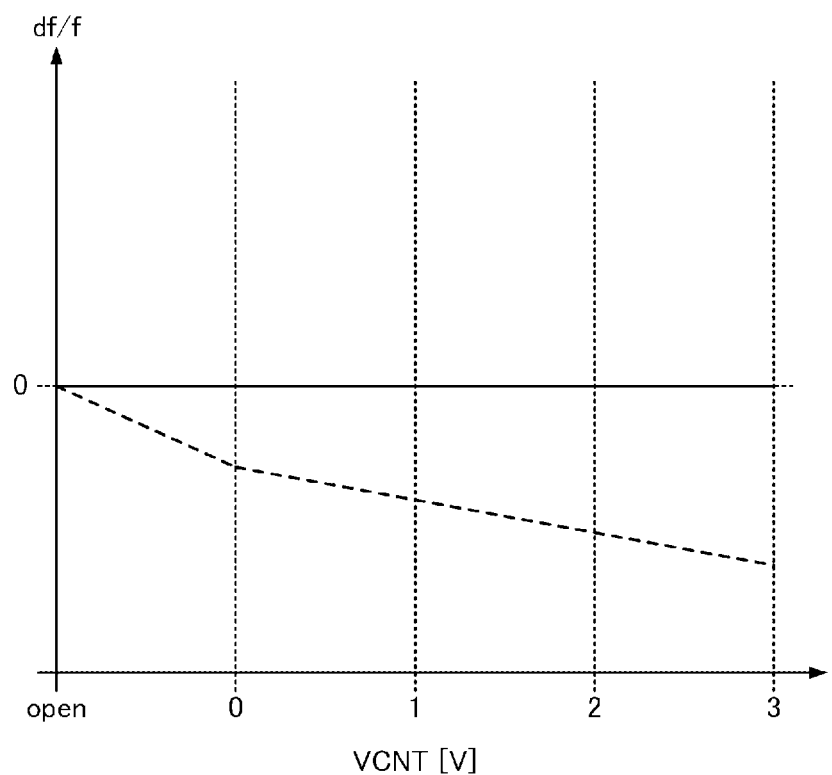
FIG. 6 is a graph illustrating frequency characteristics of the oscillator according to the exemplary embodiment and frequency characteristics of an oscillator of a comparative example.

FIG. 6 is a graph illustrating frequency characteristics of the oscillator 1 of the exemplary embodiment and frequency characteristics of an oscillator of a comparative example. The oscillator of the comparative example has the same configuration as that of the oscillator 1 except that the NMOS transistor 25 does not exist in the first switch circuit 20. In FIG. 6, the solid line is the frequency characteristics of the oscillator 1, and the broken line is the frequency characteristics of the oscillator of the comparative example. In FIG. 6, the horizontal axis represents a voltage at the VCNT terminal, and the vertical axis represents a frequency deviation based on an oscillation frequency when the VCNT terminal is open. As illustrated in FIG. 6, in the oscillator of the comparative example, the frequency deviation increases as the voltage of VCNT increases. In contrast, in the oscillator 1 of the exemplary embodiment, the frequency deviation remains zero regardless of the voltage at the VCNT terminal, and the oscillation frequency is stable.

In the oscillator 1 of the exemplary embodiment, although the oscillation frequency may slightly deviate from a target frequency due to oscillation signal leakage, the oscillation frequency can be adjusted to coincide with the target frequency by appropriately setting the frequency adjustment data DFO.

Figure 7:
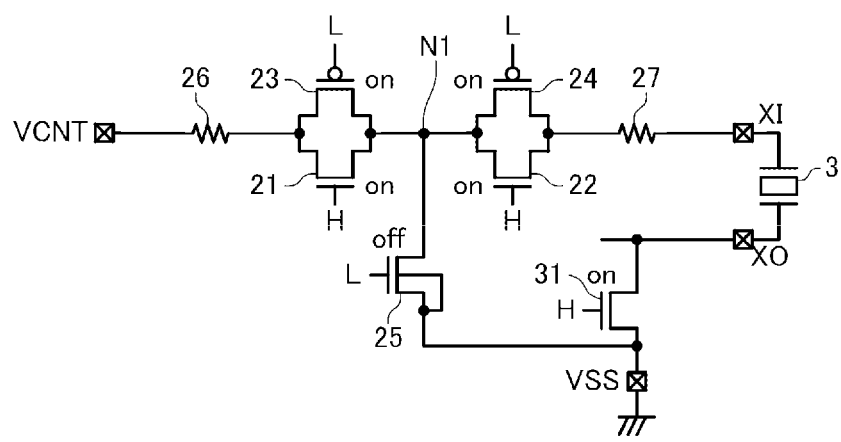
FIG. 7 is a diagram illustrating a conduction/non-conduction state of each NMOS transistor and each PMOS transistor in a second mode in the first embodiment.

As described above, in the exemplary embodiment, when the operation mode of the oscillator 1 is the resonator inspection mode, the enable signal EN is set to the low level and the switch control signal S is set to the high level. With this configuration, the oscillation circuit 2 is set to the second mode. FIG. 7 is a diagram illustrating a conduction/non-conduction state of the NMOS transistors 21, 22, 25, and 31 and the PMOS transistors 23 and 24 when the oscillation circuit 2 is in the second mode. In FIG. 7, "on" represents conduction, and "off" represents non-conduction.

As illustrated in FIG. 7, in the second mode, all of the NMOS transistors 21, 22, and 31 and the PMOS transistors 23 and 24 become conductive. With this configuration, the XI terminal and the VCNT terminal are electrically coupled, and the XO terminal and the VSS terminal are electrically coupled. Since the NMOS transistor 25 becomes non-conductive, the voltage at the node N1 is not fixed to the ground voltage. Furthermore, since the enable signal EN is at the low level, in the second mode, the amplification circuit 10 stops the amplification operation and does not oscillate the resonator 3. Accordingly, in the second mode, since the voltage at the XO terminal is not fixed to the ground voltage and the signal input to the VCNT terminal propagates to the XI terminal, for example, by inputting an AC voltage signal that swings between the power supply voltage and the ground voltage to the VCNT terminal, an overdrive inspection for removing foreign matter adhered to the resonator 3 can be performed. By inputting a plurality of AC voltage signals having different amplitudes to the VCNT terminal in a sequential order, it is possible to perform a drive level inspection for inspecting that the oscillation frequency is stable. By coupling a device such as a network analyzer to the VCNT terminal and the VSS terminal, the characteristics of the resonator 3 can be inspected.

In the exemplary embodiment, the VCNT terminal corresponds to a "first external connection terminal", the XI terminal corresponds to a "second external connection terminal", and the XO terminal corresponds to a "third external connection terminal". The VSS terminal corresponds to a "fourth external connection terminal" and the VDD terminal corresponds to a "fifth external connection terminal". The ground voltage supplied to the VSS terminal corresponds to a "first power supply voltage", and the power supply voltage supplied to the VDD terminal corresponds to a "second power supply voltage higher than the first power supply voltage". The NMOS transistor 21 corresponds to a "first switching element", and the NMOS transistor 22 corresponds to a "second switching element". The PMOS transistor 23 corresponds to a "third switching element", and the PMOS transistor 24 corresponds to a "fourth switching element". The NMOS transistor 25 corresponds to a "fifth switching element" and the NMOS transistor 31 corresponds to a "sixth switching element". The node N1 corresponds to a "first node".

Figure 8:
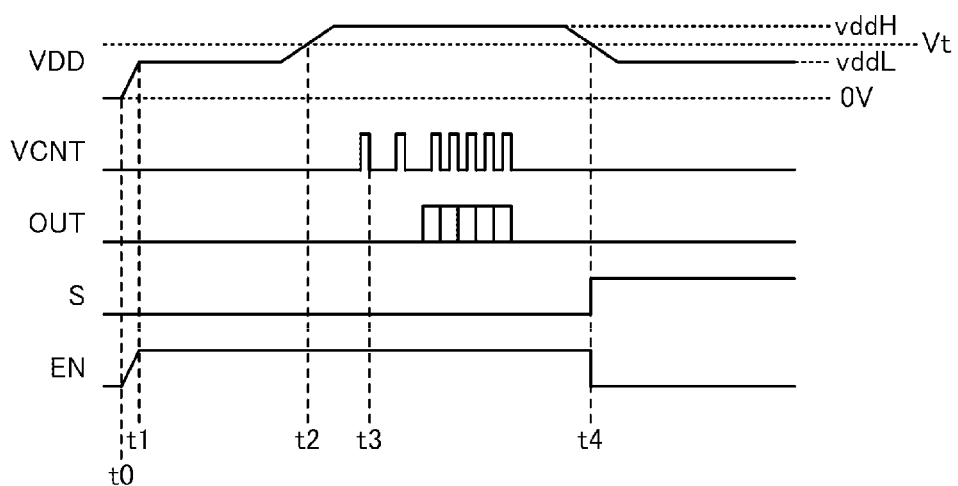
FIG. 8 is a diagram illustrating an example of a timing chart for switching from the first mode to the second mode.

FIG. 8 is a diagram illustrating an example of a timing chart for switching the oscillation circuit 2 from the first mode to the second mode. In FIG. 8, the horizontal axis represents the time, and the vertical axis represents the voltage. In the example of FIG. 8, the voltage at the VDD terminal is 0 V at time t0, becomes vddL at time t1, becomes a reference value Vt at time t2, and then rises to vddH. The interface circuit 90 starts an operation for shifting the operation mode of the oscillator 1 at time t3, which is the falling time of the first pulse of a serial clock signal supplied to the VCNT terminal, in a period in which the voltage at the VDD terminal is the voltage vddH higher than the reference value Vt. The interface circuit 90 samples the serial data signal supplied to the OUT terminal at the rising edge of a subsequent pulse of the serial clock signal, and shifts the operation mode of the oscillator 1 from the normal operation mode to the resonator inspection mode at time t4 when the voltage at the VDD terminal decreases to the reference value Vt. The interface circuit 90 switches the oscillation circuit 2 from the first mode to the second mode by changing the switch control signal S from the low level to the high level and changing the enable signal EN from the high level to the low level at time t4.

In the example of FIG. 8, although the interface circuit 90 switches the oscillation circuit 2 from the first mode to the second mode by shifting the operation mode of the oscillator 1 from the normal operation mode to the resonator inspection mode, the oscillation circuit 2 can be switched from the second mode to the first mode by shifting the operation mode of the oscillator 1 from the resonator inspection mode to the normal operation mode. As such, in the exemplary embodiment, the interface circuit 90 can select the first mode or the second mode based on the signal input from the outside of the oscillation circuit 2.

As described above, in the oscillator 1 of the first embodiment, the oscillation circuit 2 is set to the first mode in the normal operation mode and the NMOS transistor 21 and the PMOS transistor 23 do not electrically couple the VCNT terminal and the node N1, the NMOS transistor 22 and the PMOS transistor 24 do not electrically couple the node N1 and the XI terminal, and the NMOS transistor 25 electrically couples the node N1 and the VSS terminal, in the first mode. With this configuration, in the first mode, the XI terminal and the VCNT terminal are not electrically coupled and the voltage of the node N1 is fixed to the ground voltage. In the first mode, the NMOS transistor 31 does not electrically couple the VSS terminal and the XO terminal. In the first mode, the amplification circuit 10 performs an amplification operation to oscillate the resonator 3. According to the oscillator 1 of the first embodiment, in the first mode, since the voltage at the node N1 is fixed to the ground voltage, fluctuations in the oscillation frequency due to the voltage at the VCNT terminal are reduced and the oscillation frequency is stabilized.

In the oscillator 1 of the first embodiment, the oscillation circuit 2 is set to the second mode in the resonator inspection mode, and the NMOS transistor 21 and PMOS transistor 23 electrically couple the VCNT terminal and node N1, the NMOS transistor 22 and the PMOS transistor 24 electrically couple the node N1 and the XI terminal, and the NMOS transistor 25 does not electrically couple the node N1 and the VSS terminal, in the second mode. With this configuration, in the second mode, the XI terminal and the VCNT terminal are electrically coupled and the voltage of the node N1 is not fixed to the ground voltage. In the second mode, the NMOS transistor 31 electrically couples the VSS terminal and the XO terminal. In the second mode, the amplification circuit 10 stops the amplification operation and does not oscillate the resonator 3. According to the oscillator 1 of the first embodiment, in the second mode, since the voltage at the node N1 is not fixed to the ground voltage and the signal input to the VCNT terminal propagates to the XI terminal, an overdrive inspection, a drive level inspection, and the like can be performed on the resonator 3 by inputting a predetermined signal from the T4 terminal.

1-2. Second Embodiment

The oscillator 1 of the second embodiment is different from the oscillator 1 of the first embodiment in the configuration of the first switch circuit 20, and the other configurations are the same. Hereinafter, for the oscillator 1 of the second embodiment, the same reference numerals are given to the same configurations as the first embodiment, the description similar to the first embodiment is omitted or simplified, and the contents different from the first embodiment will be mainly described.

Figure 9:
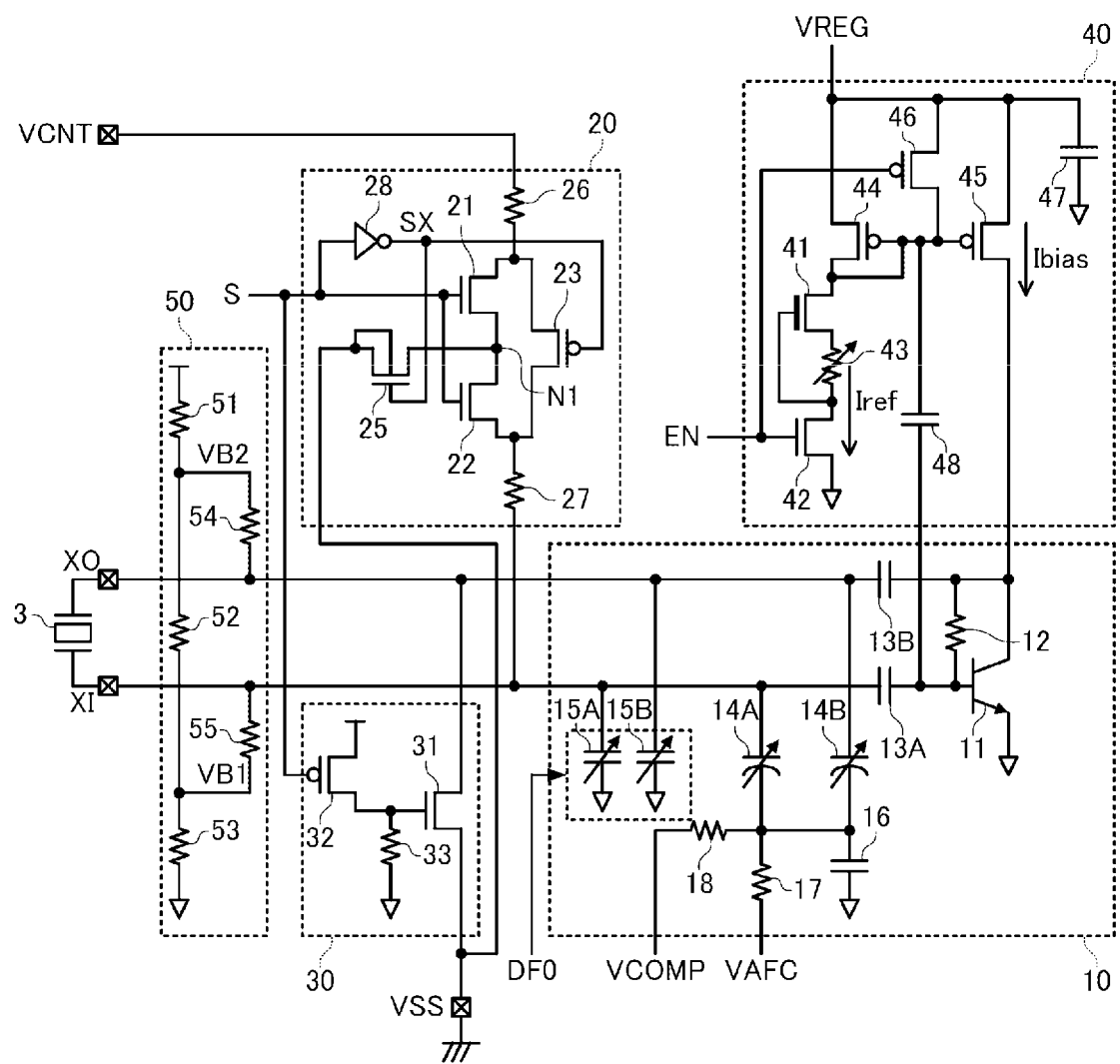
FIG. 9 is a diagram illustrating a specific configuration example of an amplification circuit, a first switch circuit, a second switch circuit, a bias current generation circuit, and a bias voltage generation circuit in a second embodiment.

FIG. 9 is a diagram illustrating a specific configuration example of the amplification circuit 10, the first switch circuit 20, the second switch circuit 30, the bias current generation circuit 40, and the bias voltage generation circuit 50 in the oscillation circuit 2 included in the oscillator 1 of the second embodiment. In FIG. 9, since the configurations of the amplification circuit 10, the second switch circuit 30, the bias current generation circuit 40, and the bias voltage generation circuit 50 are the same as those in FIG. 4, the description thereof will be omitted.

As illustrated in FIG. 9, in the oscillator 1 of the second embodiment, the first switch circuit 20 includes NMOS transistors 21, 22, and 25, the PMOS transistor 23, the resistors 26 and 27, and an inverter circuit 28.

The inverter circuit 28 receives the switch control signal S as an input and outputs the switch control signal SX with its logic inverted.

The NMOS transistor 21 is a switching element that switches whether or not to electrically couple the VCNT terminal and the node N1. The NMOS transistor 22 is a switching element that switches whether or not to electrically couple the node N1 and the XI terminal.

The PMOS transistor 23 is a switching element that switches whether or not to electrically couple the VCNT terminal and the XI terminal.

The NMOS transistor 25 is a switching element that switches whether or not to electrically couple the node N1 and the VSS terminal.

The switch control signal S is input to the gates of the NMOS transistors 21 and 22 and the switch control signal SX is input to the gates of the PMOS transistor 23 and the NMOS transistor 25.

The NMOS transistors 21 and 22 are N-channel MOS switches, respectively, and in the NMOS transistors 21 and 22, the source and the drain become conductive when the switch control signal S is at the high level and the source and the drain become non-conductive when the switch control signal S is at the low level. Accordingly, when the switch control signal S is at the low level, it becomes the first mode in which the NMOS transistor 21 does not electrically couple the VCNT terminal and the node N1 and the NMOS transistor 22 does not electrically couple the node N1 and the XI terminal. When the switch control signal S is at the high level, it becomes the second mode in which the NMOS transistor 21 electrically couples the VCNT terminal and the node N1 and the NMOS transistor 22 electrically couples the node N1 and the XI terminal. That is, the oscillation circuit 2 has the first mode and the second mode.

The PMOS transistor 23 is a P-channel MOS switch, and in the PMOS transistor 23, the source and the drain become conductive when the switch control signal S is at the high level and the source and the drain become non-conductive when the switch control signal S is at the low level. Accordingly, in the first mode, the PMOS transistor 23 does not electrically couple the VCNT terminal and the XI terminal. In the second mode, the PMOS transistor 23 electrically couples the VCNT terminal and the XI terminal.

The NMOS transistor 25 is an N-channel MOS switch, and in the NMOS transistor 25, the source and the drain become conductive when the switch control signal S is at the low level and the source and the drain become non-conductive when the switch control signal S is at the high level. Accordingly, in the first mode, the NMOS transistor 25 electrically couples the node N1 and the VSS terminal. As a result, in the first mode, the voltage at the node N1 is fixed to the ground voltage. In the second mode, the NMOS transistor 25 does not electrically couple the node N1 and the VSS terminal. As a result, in the second mode, the voltage at the node N1 is not fixed to the ground voltage.

Figure 10:
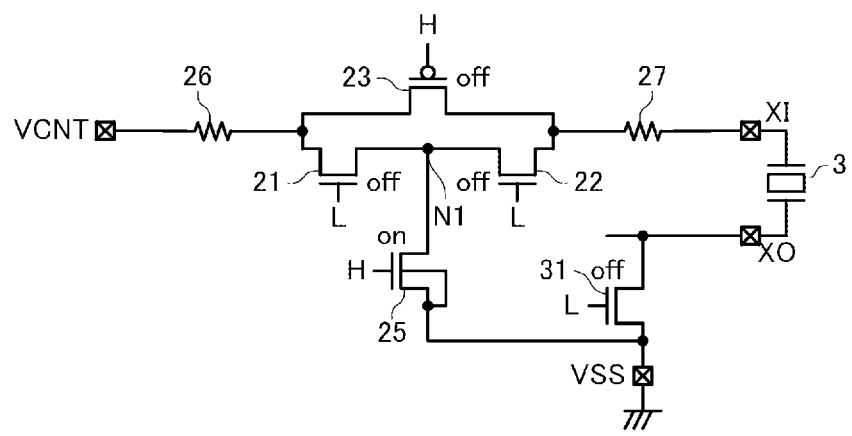
FIG. 10 is a diagram illustrating a conduction/non-conduction state of each NMOS transistor and each PMOS transistor in the first mode in the second embodiment.

In the second embodiment, similarly as in the first embodiment, when the operation mode of the oscillator 1 is the normal operation mode, the enable signal EN is set to the high level and the switch control signal S is set to the low level. With this configuration, the oscillation circuit 2 is set to the first mode. FIG. 10 is a diagram illustrating a conduction/non-conduction state of the NMOS transistors 21, 22, 25, and 31 and the PMOS transistors 23 when the oscillation circuit 2 is in the first mode. In FIG. 10, "on" represents conduction, and "off" represents non-conduction.

As illustrated in FIG. 10, in the first mode, all of the NMOS transistors 21, 22, and 31 and the PMOS transistor 23 become non-conductive. With this configuration, the XI terminal and the VCNT terminal are not electrically coupled and the XO terminal and the VSS terminal are not electrically coupled. Since the enable signal EN is at the high level, in the first mode, the amplification circuit 10 can perform an amplification operation and oscillate the resonator 3. However, when the voltage level of the oscillation signal generated at the XI terminal due to oscillation of the resonator 3 falls below the ground voltage, the NMOS transistor 22 becomes weakly conductive. As a result, although the oscillation signal may leak from the XI terminal to the node N1, in the exemplary embodiment, when the NMOS transistor 25 becomes conductive, the oscillation signal leaks to the ground, but leakage of the oscillation signal to the VCNT terminal is reduced. Furthermore, since the voltage at the node N1 is fixed to the ground voltage, an amount of oscillation signal leaked to the ground is constant, and thus fluctuations in the oscillation frequency due to the voltage at the VCNT terminal are reduced and the oscillation frequency is stabilized.

In the exemplary embodiment, the bias voltage VB1 is adjusted so that the voltage level of the oscillation signal generated at the XI terminal is always lower than the power supply voltage, and a situation in which the oscillation signal exceeds the power supply voltage does not occur. Accordingly, since the PMOS transistor 23 is in a non-conduction state and does not enter a weak conduction state, the leakage of the oscillation signal to the VCNT terminal through the PMOS transistor 23 hardly occurs.

Figure 11:
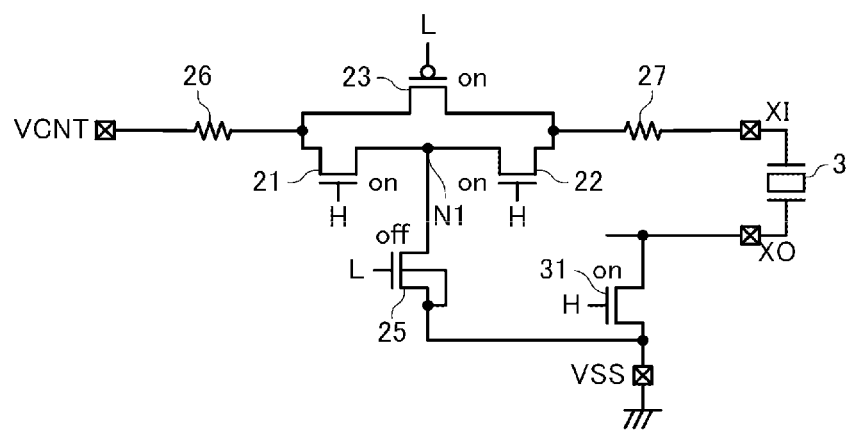
FIG. 11 is a diagram illustrating a conduction/non-conduction state of each NMOS transistor and each PMOS transistor in the second mode in the second embodiment.

In the second embodiment, similarly as in the first embodiment, when the operation mode of the oscillator 1 is the resonator inspection mode, the enable signal EN is set to the low level and the switch control signal S is set to the high level. With this configuration, the oscillation circuit 2 is set to the second mode. FIG. 11 is a diagram illustrating a conduction/non-conduction state of the NMOS transistors 21, 22, 25, and 31 and the PMOS transistor 23 when the oscillation circuit 2 is in the second mode. In FIG. 11, "on" represents conduction and "off" represents non-conduction.

As illustrated in FIG. 11, in the second mode, all of the NMOS transistors 21, 22, and 31 and the PMOS transistor become conductive. With this configuration, the XI terminal and the VCNT terminal are electrically coupled and the XO terminal and the VSS terminal are electrically coupled. Since the NMOS transistor 25 becomes non-conductive, the voltage at the node N1 is not fixed to the ground voltage. Furthermore, since the enable signal EN is at the low level, in the second mode, the amplification circuit 10 stops the amplification operation and does not oscillate the resonator 3. Accordingly, in the second mode, since the voltage of the XO terminal is not fixed to the ground voltage and the signal input to the VCNT terminal propagates to the XI terminal, an overdrive inspection can be performed by inputting an AC voltage signal that swings between a power supply voltage and a ground voltage to the VCNT terminal. The drive level inspection can be performed by inputting a plurality of AC voltage signals having different amplitudes to the VCNT terminal in a sequential order. A device such as a network analyzer can be coupled to the VCNT terminal and the VSS terminal to inspect the characteristics of the resonator 3.

In the exemplary embodiment, the VCNT terminal corresponds to the "first external connection terminal", the XI terminal corresponds to the "second external connection terminal", and the XO terminal corresponds to the "third external connection terminal". The VSS terminal corresponds to the "fourth external connection terminal", and the VDD terminal corresponds to the "fifth external connection terminal". The ground voltage supplied to the VSS terminal corresponds to the "first power supply voltage" and the power supply voltage supplied to the VDD terminal corresponds to the "second power supply voltage higher than the first power supply voltage". The NMOS transistor 21 corresponds to the "first switching element" and the NMOS transistor 22 corresponds to the "second switching element". The PMOS transistor 23 corresponds to the "third switching element". The NMOS transistor 25 corresponds to the "fifth switching element" and the NMOS transistor 31 corresponds to the "sixth switching element". The node N1 corresponds to the "first node".

As described above, in the oscillator 1 of the second embodiment, the oscillation circuit 2 is set to the first mode in the normal operation mode and the NMOS transistor 21 does not electrically couple the VCNT terminal and the node N1, the NMOS transistor 22 does not electrically couple the node N1 and the XI terminal, the PMOS transistor 23 does not electrically couple the VCNT terminal and the XI terminal, and the NMOS transistor 25 electrically couples the node N1 and the VSS terminal, in the first mode. With this configuration, in the first mode, the XI terminal and the VCNT terminal are not electrically coupled and the voltage of the node N1 is fixed to the ground voltage. In the first mode, the NMOS transistor 31 does not electrically couple the VSS terminal and the XO terminal. In the first mode, the amplification circuit 10 performs an amplification operation to oscillate the resonator 3. According to the oscillator 1 of the second embodiment, in the first mode, since the voltage at the node N1 is fixed to the ground voltage, fluctuations in the oscillation frequency due to the voltage at the VCNT terminal are reduced and the oscillation frequency is stabilized.

In the oscillator 1 of the second embodiment, the oscillation circuit 2 is set to the second mode in the resonator inspection mode, and the NMOS transistor 21 electrically couples the VCNT terminal and node N1, the NMOS transistor 22 electrically couples the node N1 and the XI terminal, the PMOS transistor 23 electrically couples the VCNT terminal and the XI terminal, and the NMOS transistor 25 does not electrically couple the node N1 and the VSS terminal, in the second mode. With this configuration, in the second mode, the XI terminal and the VCNT terminal are electrically coupled and the voltage of the node N1 is not fixed to the ground voltage. In the second mode, the NMOS transistor 31 electrically couples the VSS terminal and the XO terminal. In the second mode, the amplification circuit 10 stops the amplification operation and does not oscillate the resonator 3. According to the oscillator 1 of the second embodiment, in the second mode, since the voltage at the node N1 is not fixed to the ground voltage and the signal input to the VCNT terminal propagates to the XI terminal, an overdrive inspection, a drive level inspection, and the like can be performed on the resonator 3 by inputting a predetermined signal from the T4 terminal.

1-3. Third Embodiment

The oscillator 1 of the third embodiment is different from the oscillator 1 of the first embodiment in the configuration and connection destination of the first switch circuit 20 and the connection destination of the second switch circuit 30, and the other configurations and connection relationships are the same. Hereinafter, for the oscillator 1 of the third embodiment, the same reference numerals are given to the same configurations as the first embodiment, the description similar to the first embodiment is omitted or simplified, and the contents different from the first embodiment will be mainly described.

Figure 12:
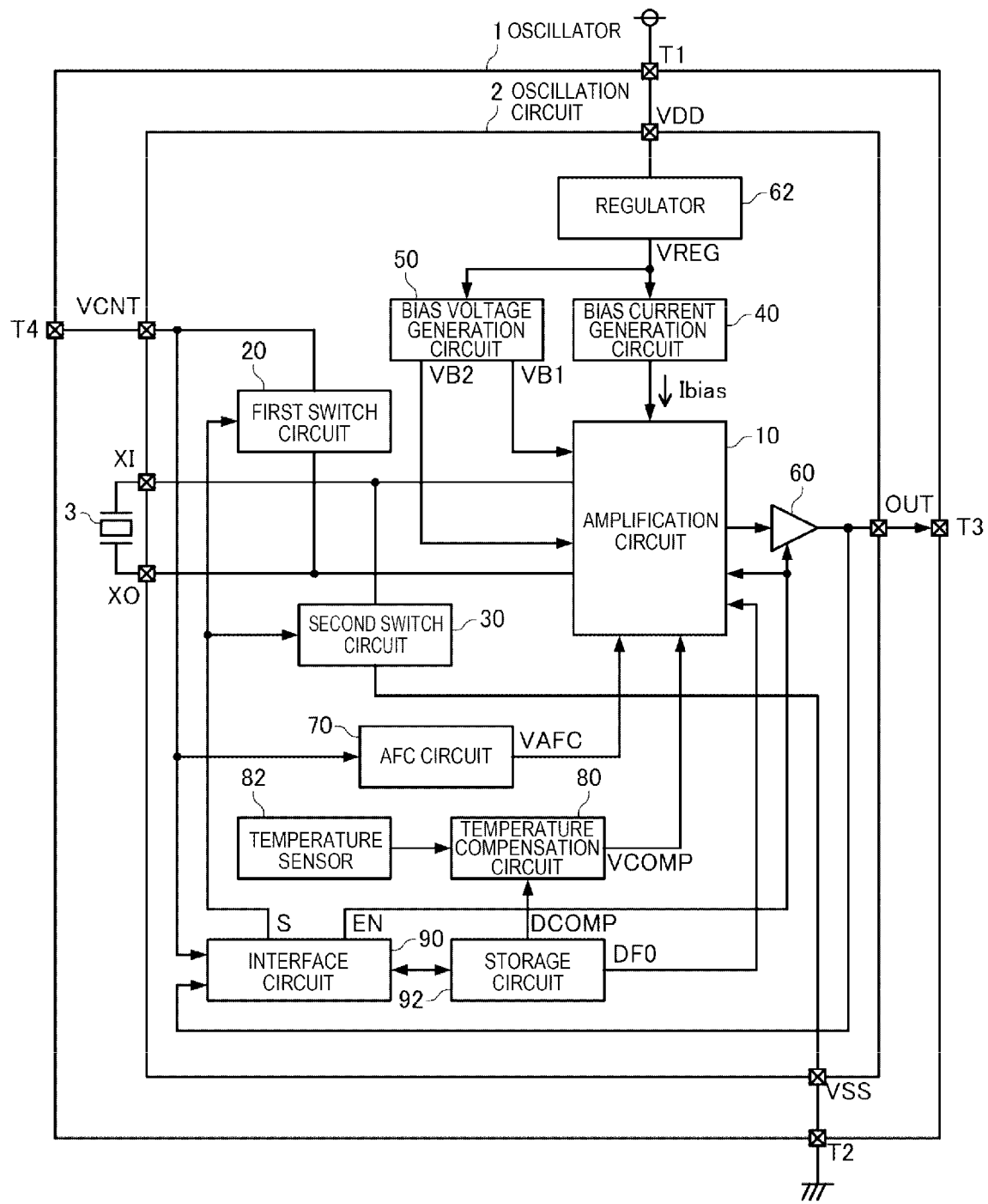
FIG. 12 is a functional block diagram of an oscillator according to a third embodiment.

FIG. 12 is a functional block diagram of the oscillator 1 according to the third embodiment. As illustrated in FIG. 12, in the oscillator 1 of the third embodiment, the first switch circuit 20 included in the oscillation circuit 2 determines whether to electrically couple the VCNT terminal and the XO terminal based on the switch control signal S. In the exemplary embodiment, the first switch circuit 20 electrically couples the VCNT terminal and the XO terminal when the switch control signal S is at the high level, and electrically discouples the VCNT terminal and the XO terminal when the switch control signal S is at the low level.

The second switch circuit 30 is a circuit for switching whether or not to electrically couple the VSS terminal and the XI terminal based on the switch control signal S. In the exemplary embodiment, the second switch circuit 30 electrically couples the VSS terminal and the XI terminal when the switch control signal S is at the high level, and electrically discouples the VSS terminal and the XI terminal when the switch control signal S is at the low level.

Figure 13:
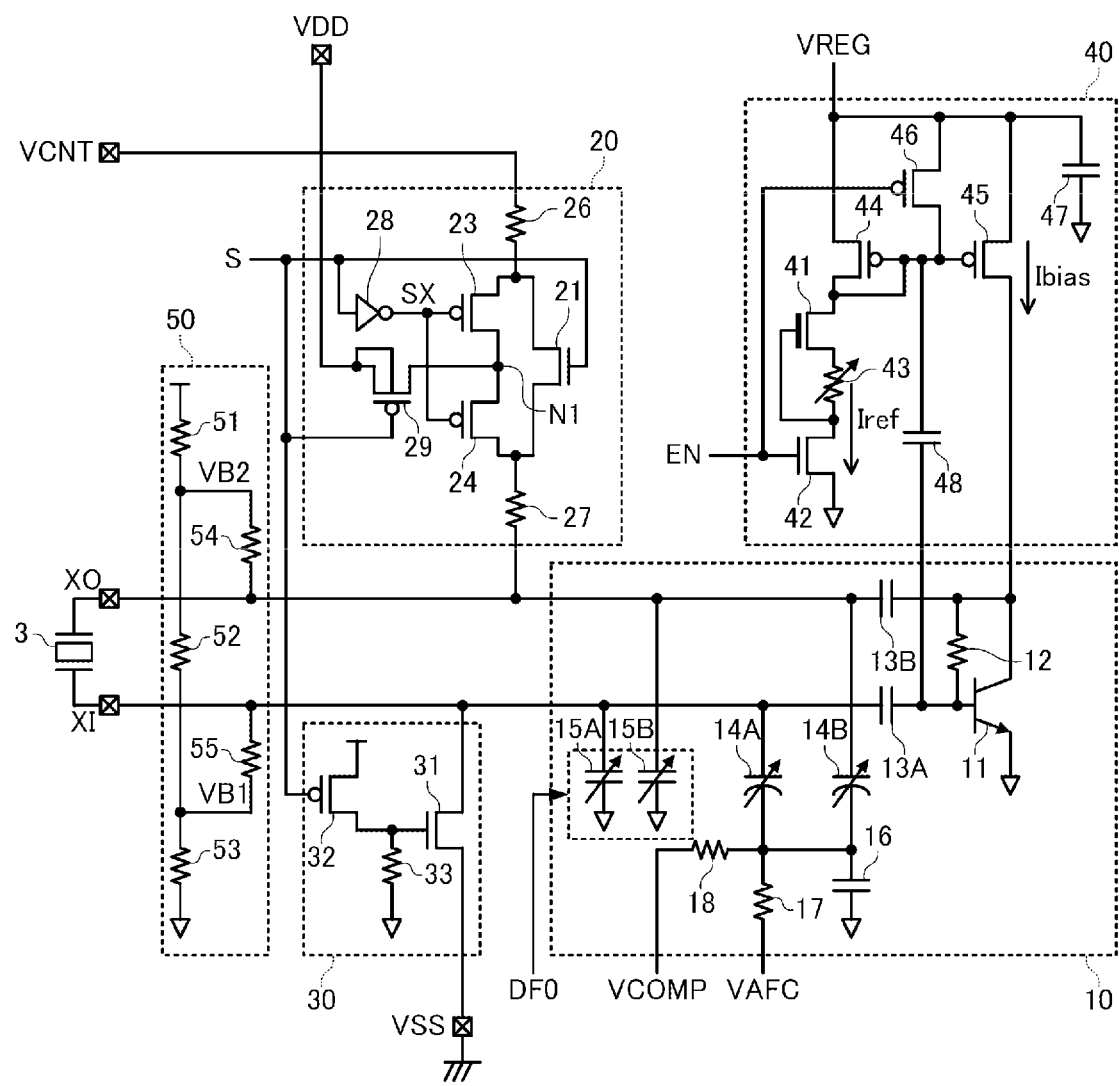
FIG. 13 is a diagram illustrating a specific configuration example of an amplification circuit, a first switch circuit, a second switch circuit, a bias current generation circuit, and a bias voltage generation circuit in the third embodiment.

FIG. 13 is a diagram illustrating a specific configuration example of the amplification circuit 10, the first switch circuit 20, the second switch circuit 30, the bias current generation circuit 40, and the bias voltage generation circuit 50 in the oscillation circuit 2 included in the oscillator 1 of the third embodiment. In FIG. 13, since the configurations of the amplification circuit 10, the second switch circuit 30, the bias current generation circuit 40, and the bias voltage generation circuit 50 are the same as those in FIG. 4, the description thereof will be omitted.

As illustrated in FIG. 13, in the oscillator 1 of the third embodiment, the first switch circuit 20 includes the NMOS transistor 21, the PMOS transistors 23, 24 and 29, the resistors 26 and 27, and the inverter circuit 28.

The inverter circuit 28 receives the switch control signal S as an input and outputs the switch control signal SX with its logic inverted.

The PMOS transistor 23 is a switching element that switches whether or not to electrically couple the VCNT terminal and the node N1. The PMOS transistor 24 is a switching element that switches whether or not to electrically couple the node N1 and the XO terminal.

The NMOS transistor 21 is a switching element that switches whether or not to electrically couple the VCNT terminal and the XO terminal.

The PMOS transistor 29 is a switching element that switches whether or not to electrically couple the node N1 and the VDD terminal.

The switch control signal SX is input to the gates of the PMOS transistors 23 and 24, and the switch control signal S is input to the gates of the NMOS transistor 21 and the PMOS transistor 29.

The PMOS transistors 23 and 24 are P-channel MOS switches, respectively, and in the PMOS transistors 23 and 24, the source and the drain become conductive when the switch control signal S is at the high level and the source and the drain become non-conductive and when the switch control signal S is at the low level. Accordingly, when the switch control signal S is at the low level, it becomes the first mode in which the PMOS transistor 23 does not electrically couple the VCNT terminal and the node N1 and the PMOS transistor 24 does not electrically couple the node N1 and the XO terminal. When the switch control signal S is at the high level, it becomes the second mode in which the PMOS transistor 23 electrically couples the VCNT terminal and the node N1 and the PMOS transistor 24 electrically couples the node N1 and the XO terminal. That is, the oscillation circuit 2 has the first mode and the second mode.

The NMOS transistor 21 is a N-channel MOS switch, and in the NMOS transistor 21, the source and the drain become conductive when the switch control signal S is at the high level and the source and the drain become non-conductive when the switch control signal S is at the low level. Accordingly, in the first mode, the NMOS transistor 21 does not electrically couple the VCNT terminal and the XO terminal. In the second mode, the NMOS transistor 21 electrically couples the VCNT terminal and the XO terminal.

The PMOS transistor 29 is a P-channel MOS switch, and in the PMOS transistor 29, the source and the drain become conductive when the switch control signal S is at the low level and the source and the drain become non-conductive when the switch control signal S is at the high level. Accordingly, in the first mode, the PMOS transistor 29 electrically couples the node N1 and the VDD terminal. As a result, in the first mode, the voltage at the node N1 is fixed to the power supply voltage. In the second mode, the PMOS transistor 29 does not electrically couple the node N1 and the VDD terminal. As a result, in the second mode, the voltage at the node N1 is not fixed to the power supply voltage.

The second switch circuit 30 includes the NMOS transistor 31, the PMOS transistor 32, and the resistor 33. The switch control signal S is input to the gate of the PMOS transistor 32, a power supply voltage is supplied to the source thereof, and the drain thereof is electrically coupled to the gate of the NMOS transistor 31 and one end of the resistor 33. The other end of the resistor 33 is grounded. When the switch control signal S is at the low level, the source and drain of the PMOS transistor 32 become conductive and the voltage at the gate of the NMOS transistor 31 becomes the high level. When the switch control signal S is at the high level, the source and drain of the PMOS transistor 32 become non-conductive and the voltage at the gate of the NMOS transistor 31 becomes the low level.

The NMOS transistor 31 is a switching element that switches whether or not to electrically couple the VSS terminal and the XI terminal. The NMOS transistor 31 is an N-channel MOS switch, and in the NMOS transistor 31, the source and the drain become conductive when the switch control signal S is at the low level and the source and the drain become non-conductive when the switch control signal S is at the high level. Accordingly, in the first mode, the NMOS transistor 31 does not electrically couple the VSS terminal and the XI terminal. In the second mode, the NMOS transistor 31 electrically couples the VSS terminal and the XI terminal.

Figure 14:
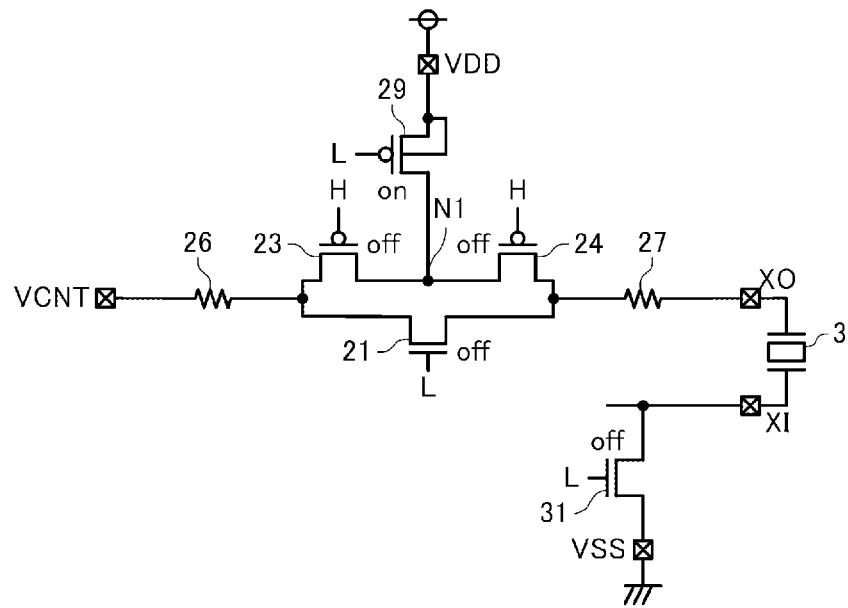
FIG. 14 is a diagram illustrating a conduction/non-conduction state of each NMOS transistor and each PMOS transistor in the first mode in the third embodiment.

In the third embodiment, similarly as in the first embodiment, when the operation mode of the oscillator 1 is the normal operation mode, the enable signal EN is set to the high level and the switch control signal S is set to the low level. With this configuration, the oscillation circuit 2 is set to the first mode. FIG. 14 is a diagram illustrating a conduction/non-conduction state of the NMOS transistors 21 and 31 and the PMOS transistors 23, 24, and 29 when the oscillation circuit 2 is in the first mode. In FIG. 14, "on" represents conduction, and "off" represents non-conduction.

As illustrated in FIG. 14, in the first mode, all of the NMOS transistors 21 and 31 and the PMOS transistors 23, 24, and 29 become non-conductive. With this configuration, the XO terminal and the VCNT terminal are not electrically coupled and the XI terminal and the VSS terminal are not electrically coupled. Since the enable signal EN is at the high level, in the first mode, the amplification circuit 10 can perform an amplification operation and oscillate the resonator 3. However, when the voltage level of the oscillation signal generated at the XO terminal due to oscillation of the resonator 3 exceeds the power supply voltage, the PMOS transistor 24 becomes weakly conductive. As a result, although the oscillation signal may leak from the XO terminal to the node N1, in the exemplary embodiment, when the PMOS transistor 29 becomes conductive, the oscillation signal leaks to the power supply, but leakage of the oscillation signal to the VCNT terminal is reduced. Furthermore, since the voltage at the node N1 is fixed to the power supply voltage, an amount of oscillation signal leaked to the power supply is constant, and thus fluctuations in the oscillation frequency due to the voltage at the VCNT terminal are reduced and the oscillation frequency is stabilized.

In the exemplary embodiment, the bias voltage VB2 is adjusted so that the voltage level of the oscillation signal generated at the XO terminal is always higher than the ground voltage, and a situation in which the oscillation signal falls below the ground voltage does not occur. Accordingly, since the NMOS transistor 21 is in a non-conduction state and does not enter a weak conduction state, the leakage of the oscillation signal to the VCNT terminal through the NMOS transistor 21 hardly occurs.

Figure 15:
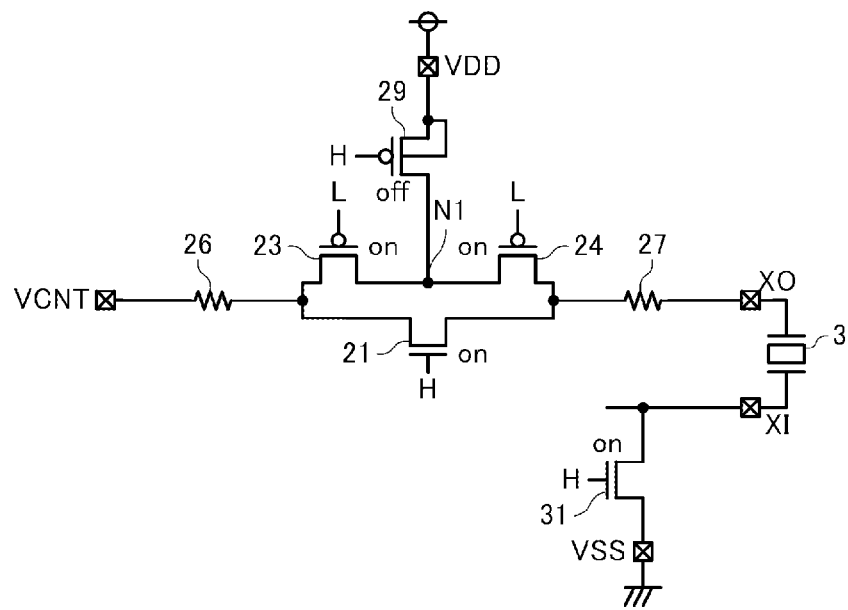
FIG. 15 is a diagram illustrating a conduction/non-conduction state of each NMOS transistor and each PMOS transistor in the second mode in the third embodiment.

In the third embodiment, similarly as in the first embodiment, when the operation mode of the oscillator 1 is the resonator inspection mode, the enable signal EN is set to the low level and the switch control signal S is set to the high level. With this configuration, the oscillation circuit 2 is set to the second mode. FIG. 15 is a diagram illustrating a conduction/non-conduction state of the NMOS transistors 21 and 31 and the PMOS transistors 23, 24, and 29 when the oscillation circuit 2 is in the second mode. In FIG. 15, "on" represents conduction and "off" represents non-conduction.

As illustrated in FIG. 15, in the second mode, all of the NMOS transistors 21 and 31 and the PMOS transistors 23, 24, and 29 become conductive. With this configuration, the XO terminal and the VCNT terminal are electrically coupled and the XI terminal and the VSS terminal are electrically coupled. Since the PMOS transistor 29 becomes non-conductive, the voltage at the node N1 is not fixed to the power supply voltage. Furthermore, since the enable signal EN is at the low level, in the second mode, the amplification circuit 10 stops the amplification operation and does not oscillate the resonator 3. Accordingly, in the second mode, since the voltage of the XI terminal is not fixed to the ground voltage and the signal input to the VCNT terminal propagates to the XO terminal, an overdrive inspection can be performed by inputting an AC voltage signal that swings between the power supply voltage and the ground voltage to the VCNT terminal. The drive level inspection can be performed by inputting a plurality of AC voltage signals having different amplitudes to the VCNT terminal in a sequential order. A device such as a network analyzer can be coupled to the VCNT terminal and the VSS terminal to inspect the characteristics of the resonator 3.

In the exemplary embodiment, the VCNT terminal corresponds to the "first external connection terminal", the XO terminal corresponds to the "second external connection terminal", and the XI terminal corresponds to the "third external connection terminal". The VSS terminal corresponds to the "fourth external connection terminal", and the VDD terminal corresponds to the "fifth external connection terminal". The ground voltage supplied to the VSS terminal corresponds to the "first power supply voltage" and the power supply voltage supplied to the VDD terminal corresponds to the "second power supply voltage higher than the first power supply voltage". The PMOS transistor 23 corresponds to the "first switching element" and the PMOS transistor 24 corresponds to the "second switching element". The NMOS transistor 21 corresponds to the "third switching element". The PMOS transistor 29 corresponds to the "fourth switching element" and the NMOS transistor 31 corresponds to the "fifth switching element". The node N1 corresponds to the "first node".

As described above, in the oscillator 1 of the third embodiment, the oscillation circuit 2 is set to the first mode in the normal operation mode and the PMOS transistor 23 does not electrically couple the VCNT terminal and the node N1, the PMOS transistor 24 does not electrically couple the node N1 and the XO terminal, the NMOS transistor 21 does not electrically couple the VCNT terminal and the XO terminal, and the PMOS transistor 29 electrically couples the node N1 and the VDD terminal, in the first mode. With this configuration, in the first mode, the XO terminal and the VCNT terminal are not electrically coupled and the voltage of the node N1 is fixed to the power supply voltage. In the first mode, the NMOS transistor 31 does not electrically couple the VSS terminal and the XI terminal. In the first mode, the amplification circuit 10 performs an amplification operation to oscillate the resonator 3. According to the oscillator 1 of the third embodiment, in the first mode, since the voltage at the node N1 is fixed to the power supply voltage, fluctuations in the oscillation frequency due to the voltage at the VCNT terminal are reduced and the oscillation frequency is stabilized.

In the oscillator 1 of the third embodiment, the oscillation circuit 2 is set to the second mode in the resonator inspection mode, and the PMOS transistor 23 electrically couples the VCNT terminal and node N1, the PMOS transistor 24 electrically couples the node N1 and the XO terminal, the NMOS transistor 21 electrically couples the VCNT terminal and the XO terminal, and the PMOS transistor 29 does not electrically couple the node N1 and the VDD terminal, in the second mode. With this configuration, in the second mode, the XO terminal and the VCNT terminal are electrically coupled and the voltage of the node N1 is not fixed to the power supply voltage. In the second mode, the NMOS transistor 31 electrically couples the VSS terminal and the XI terminal. In the second mode, the amplification circuit 10 stops the amplification operation and does not oscillate the resonator 3. According to the oscillator 1 of the third embodiment, in the second mode, since the voltage at the node N1 is not fixed to the power supply voltage and the signal input to the VCNT terminal propagates to the XO terminal, an overdrive inspection, a drive level inspection, and the like can be performed on the resonator 3 by inputting a predetermined signal from the T4 terminal.

1-4. Modification Example

In each of the embodiments described above, in the second mode, although the VCNT terminal and the VSS terminal are electrically coupled to both ends of the resonator 3, the terminals electrically coupled to both ends of the resonator 3 are not limited to the VCNT terminal and VSS terminal. For example, in the second mode, the VDD terminal and the VSS terminal may be electrically coupled to both ends of the resonator 3.

In each of the embodiments described above, the interface circuit 90 shifts the operation mode of the oscillator 1 based on the serial clock signal and the serial data signal input from the VCNT terminal and the OUT terminal in a period during which the voltage at the VDD terminal is higher than the reference value Vt, but the method of shifting the operation mode of the oscillator 1 is not limited thereto. For example, the interface circuit 90 may shift the operation mode of the oscillator 1 based on the serial clock signal and the serial data signal input from the VCNT terminal and the OUT terminal in a predetermined period after supply of the power supply voltage to the VDD terminal is started.

In each of the embodiments described above, for the oscillation circuit 2, the serial clock signal is input from the VCNT terminal and the serial data signal is input from the OUT terminal, but terminals to which the serial clock signal and serial data signal are input may be terminals other than the VCNT terminal and OUT terminal.

The oscillator 1 of each of the embodiments described above is an oscillator having a temperature compensation function and a frequency control function such as a voltage controlled temperature compensated crystal oscillator (VC-TCXO), but a simple oscillator not having the temperature compensation function and the frequency control function such as a simple packaged crystal oscillator (SPXO), an oscillator having the temperature compensation function such as a temperature compensated crystal oscillator (TCXO), an oscillator having a frequency control function such as a voltage controlled crystal oscillator (VCXO), an oscillator having a temperature control function such as an oven controlled crystal oscillator (OCXO), or the like may be used.

2. Electronic Device

Figure 16:
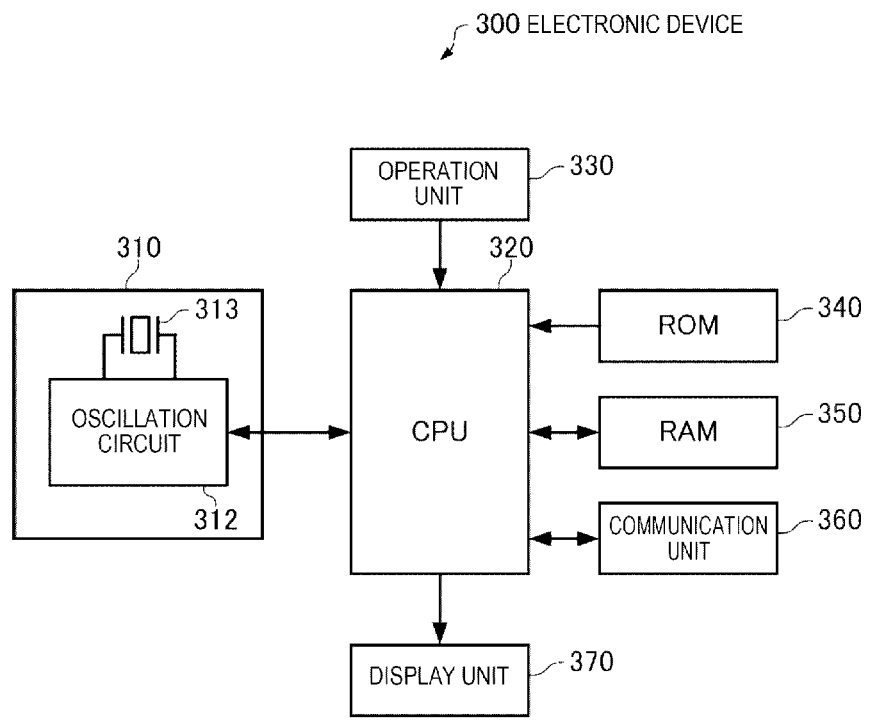
FIG. 16 is a functional block diagram of an electronic device according to the exemplary embodiment.
Figure 17:
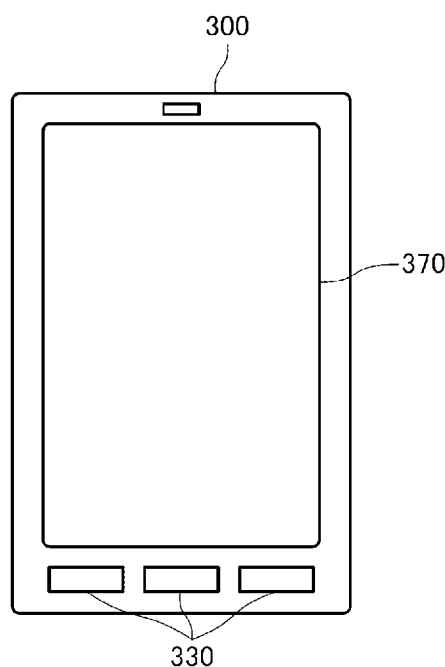
FIG. 17 is a diagram illustrating an example of an appearance of the electronic device according to the exemplary embodiment.

FIG. 16 is a functional block diagram illustrating an example of a configuration of an electronic device of the exemplary embodiment. FIG. 17 is a diagram illustrating an example of the appearance of a smartphone that is an example of an electronic device of the exemplary embodiment.

An electronic device 300 according to the exemplary embodiment is configured to include an oscillator 310, a central processing unit (CPU) 320, an operation unit 330, a read only memory (ROM) 340, a random access memory (RAM) 350, a communication unit 360, and a display unit 370. The electronic device of the exemplary embodiment may have a configuration in which some of constitutional elements in FIG. 16 are omitted or changed, or other constitutional elements are added.

An oscillator 310 includes an oscillation circuit 312 and a resonator 313. The oscillation circuit 312 oscillates the resonator 313 and generates an oscillation signal. The oscillation signal is output from an external terminal of the oscillator 310 to the CPU 320.

The CPU 320 is a processing unit that performs various calculation processing and control processing using an oscillation signal input from the oscillator 310 as a clock signal in accordance with a program stored in the ROM 340 or the like. Specifically, the CPU 320 performs various processing according to operation signals from the operation unit 330, processing for controlling the communication unit 360 to perform data communication with an external device, and processing for transmitting a display signal for displaying various types of information on the display unit 370, and the like.

The operation unit 330 is an input device including operation keys, button switches, and the like, and outputs an operation signal corresponding to an operation by a user to the CPU 320.

The ROM 340 is a storage unit that stores programs, data, and the like for the CPU 320 to perform various calculation processing and control processing.

The RAM 350 is used as a work area of the CPU 320, and is a storage unit that temporarily stores programs and data read from the ROM 340, data input from the operation unit 330, operation results executed by the CPU 320 according to various programs, and the like.

The communication unit 360 performs various controls for establishing data communication between the CPU 320 and the external device.

The display unit 370 is a display device configured by a liquid crystal display (LCD) or the like, and displays various types of information based on the display signal input from the CPU 320. The display unit 370 may be provided with a touch panel that functions as the operation unit 330.

For example, by applying the oscillator 1 of each embodiment described above as the oscillator 310, the oscillation frequency can be stabilized, and thus a highly reliable electronic device can be realized.

Various electronic devices are conceivable as such an electronic device 300, and examples thereof include a personal computer such as a mobile-type computer, a laptop-type computer, a tablet-type computer, a mobile terminal such as a smartphone and a mobile phone, a digital camera, an ink jet ejection device such as an ink jet printer, a storage area network device such as a router and a switch, local area network equipment, mobile terminal base station equipment, a TV, a video camera, a video recorder, a car navigation device, a real-time clock device, a pager, an electronic notebook, an electronic dictionary, a calculator, an electronic game device, a game controller, a word processor, a workstation, a video phone, a crime prevention TV monitor, electronic binoculars, a POS terminal, medical equipment such as an electronic thermometer, a blood pressure monitor, a blood glucose meter, an electrocardiogram measuring device, an ultrasonic diagnostic device, an electronic endoscope, a fish finder, various measuring instruments, instruments for a vehicle, an aircraft, a ship, and the like, a flight simulator, a head mounted display, a motion tracing device, a motion tracking device, a motion controller, and a pedestrian dead reckoning (PDR) device.

As an example of the electronic device 300 of the exemplary embodiment, a transmission apparatus that functions as a terminal base station apparatus or the like that performs communication with a terminal in a wired or wireless manner using the oscillator 310 described above as a reference signal source may be included. As the oscillator 310, for example, by applying the oscillator 1 of each of the embodiments described above, it is also possible to realize the electronic device 300 that can be used for, for example, a communication base station and that is desired to have high frequency accuracy, high performance, and high reliability at a lower cost than in the past.

Another example of the electronic device 300 according to the exemplary embodiment may be a communication apparatus including a frequency control unit in which the communication unit 360 receives an external clock signal and the CPU 320 controls the frequency of the oscillator 310 based on the external clock signal and an output signal of the oscillator 310. The communication apparatus may be, for example, a backbone network device such as Stratum 3 or a communication device used for a femtocell.

3. Vehicle

Figure 18:
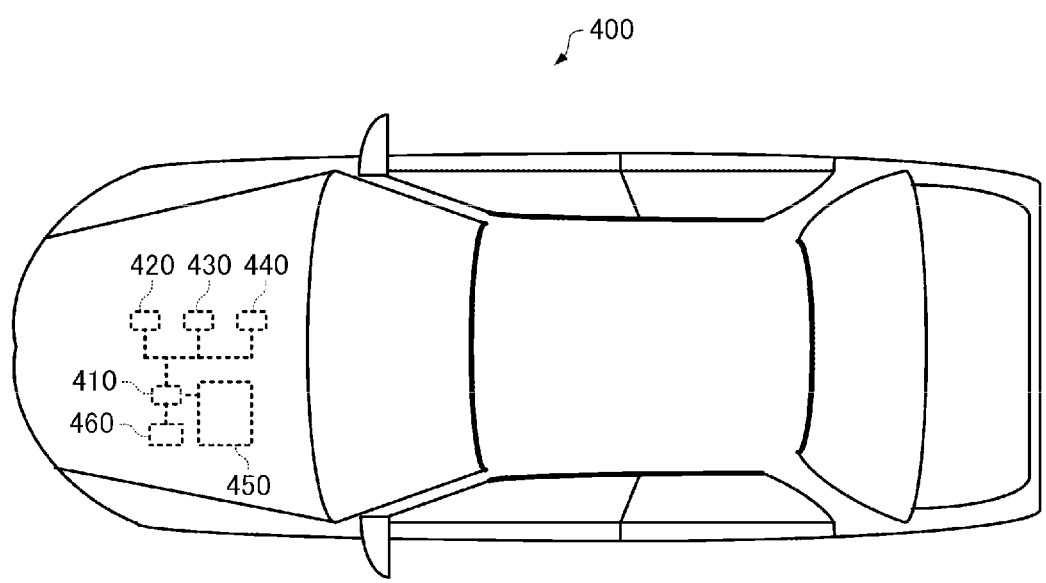
FIG. 18 is a diagram illustrating an example of a vehicle according to the exemplary embodiment.

FIG. 18 is a diagram illustrating an example of a vehicle according to the exemplary embodiment. A vehicle 400 illustrated in FIG. 18 is configured to include an oscillator 410, controllers 420, 430, and 440 that perform various controls for an engine system, a brake system, a keyless entry system, and the like, a battery 450, and a backup battery 460. The vehicle according to the exemplary embodiment may have a configuration in which some of the constitutional elements in FIG. 18 are omitted or other components are added.

The oscillator 410 includes an oscillation circuit (not illustrated) and a resonator, and the oscillation circuit oscillates the resonator and generates an oscillation signal. This oscillation signal is output from the external terminal of the oscillator 410 to the controllers 420, 430, and 440 and used as, for example, a clock signal.

The battery 450 supplies power to the oscillator 410 and the controllers 420, 430, and 440. The backup battery 460 supplies power to the oscillator 410 and the controllers 420, 430, and 440 when an output voltage of the battery 450 falls below a threshold value.

For example, by applying the oscillator 1 of each of the embodiments described above as the oscillator 410, the oscillation frequency can be stabilized, and thus a highly reliable vehicle can be realized.

As such a vehicle 400, various vehicles are conceivable, and examples thereof may include automobiles such as electric cars, airplanes such as jets and helicopters, ships, rockets, and artificial satellites.

The present disclosure is not limited to the exemplary embodiment, and various modification examples may be made thereto within the scope of the gist of the present disclosure.

The embodiments and modification example described above are merely examples, and the present disclosure is not limited thereto. For example, it is possible to appropriately combine each embodiment and each modification example.

The present disclosure includes configurations that are substantially the same as the configurations described in the embodiments, for example, configurations that have the same functions, methods, and results, or configurations that have the same purposes and effects. The present disclosure includes a configuration in which a non-essential part of the configuration described in the embodiment is replaced. The present disclosure includes a configuration that exhibits the same operational effects as the configuration described in the embodiment or a configuration that can achieve the same object. The present disclosure includes a configuration in which a known technique is added to the configuration described in the embodiment.

What is claimed is:

1. An oscillation circuit, comprising:
   a first external connection terminal;
   a second external connection terminal that is electrically coupled to one end of a resonator;
   a third external connection terminal that is electrically coupled to the other end of the resonator;
   an amplification circuit that is electrically coupled to the second external connection terminal and the third external connection terminal, amplifies a signal output from the resonator, and supplies the amplified signal to the resonator;
   a first node;
   a first switching element that switches whether or not to electrically couple the first external connection terminal and the first node;
   a second switching element that switches whether or not to electrically couple the first node and the second external connection terminal;
   a third switching element that switches whether or not to electrically couple the first external connection terminal and the first node; and
   a fourth switching element that switches whether or not to electrically couple the first node and the second external connection terminal,
   wherein
   the oscillation circuit has
      a first mode in which the first switching element does not electrically couple the first external connection terminal and the first node and the second switching element does not electrically couple the first node and the second external connection terminal, and
      a second mode in which the first switching element electrically couples the first external connection terminal and the first node and the second switching element electrically couples the first node and the second external connection terminal,
   in the first mode, a voltage of the first node is fixed,
   in the first mode, the third switching element does not electrically couple first external connection terminal and the first node and the fourth switching element does not electrically couple the first node and the second external connection terminal,
   in the second mode, the third switching element electrically couples the first external connection terminal and the first node and the fourth switching element electrically couples the first node and the second external connection terminal,
   each of the first switching element and the second switching element is an N-channel MOS switch, and
   each of the third switching element and the fourth switching element is a P-channel MOS switch.

2. The oscillation circuit according to claim 1, further comprising:
   a fourth external connection terminal to which a first power supply voltage is supplied;
   a fifth external connection terminal to which a second power supply voltage higher than the first power supply voltage is supplied; and
   a fifth switching element that switches whether or not to electrically couple the first node and the fourth external connection terminal, wherein
   in the first mode, the fifth switching element electrically couples the first node and the fourth external connection terminal,
   in the second mode, the fifth switching element does not electrically couple the first node and the fourth external connection terminal, and
   the fifth switching element is an N-channel MOS switch.

3. The oscillation circuit according to claim 2, further comprising:
   a sixth switching element that switches whether or not to electrically couple the fourth external connection terminal and the third external connection terminal, wherein
   in the first mode, the sixth switching element does not electrically couple the fourth external connection terminal and the third external connection terminal, and in the second mode, the sixth switching element electrically couples the fourth external connection terminal and the third external connection terminal.

4. The oscillation circuit according to claim 1, wherein
in the first mode, the amplification circuit performs an amplification operation for amplifying a signal output from the resonator, and
in the second mode, the amplification circuit stops the amplification operation.

5. The oscillation circuit according to claim 1, further comprising:
an interface circuit that selects the first mode or the second mode based on a signal input from the outside of the oscillation circuit.

6. An oscillator comprising:
the oscillation circuit according to claim 1; and
the resonator.

7. An oscillation circuit, comprising:
a first external connection terminal;
a second external connection terminal that is electrically coupled to one end of a resonator;
a third external connection terminal that is electrically coupled to the other end of the resonator;
an amplification circuit that is electrically coupled to the second external connection terminal and the third external connection terminal, amplifies a signal output from the resonator, and supplies the amplified signal to the resonator;
a first node;
a first switching element that switches whether or not to electrically couple the first external connection terminal and the first node;
a second switching element that switches whether or not to electrically couple the first node and the second external connection terminal;
a third switching element that switches whether or not to electrically couple the first external connection terminal and the second external connection terminal,
wherein
the oscillation circuit has
a first mode in which the first switching element does not electrically couple the first external connection terminal and the first node and the second switching element does not electrically couple the first node and the second external connection terminal, and
a second mode in which the first switching element electrically couples the first external connection terminal and the first node and the second switching element electrically couples the first node and the second external connection terminal,
in the first mode, a voltage of the first node is fixed,
in the first mode, the third switching element does not electrically couple the first external connection terminal and the second external connection terminal,
in the second mode, the third switching element electrically couples the first external connection terminal and the second external connection terminal,
each of the first switching element and the second switching element is an N-channel MOS switch, and
the third switching element is a P-channel MOS switch.

8. The oscillation circuit according to claim 7, wherein
in the first mode, the amplification circuit performs an amplification operation for amplifying a signal output from the resonator, and
in the second mode, the amplification circuit stops the amplification operation.

9. The oscillation circuit according to claim 7, further comprising:
an interface circuit that selects the first mode or the second mode based on a signal input from the outside of the oscillation circuit.

10. An oscillator comprising:
the oscillation circuit according to claim 7; and
the resonator.

11. An oscillation circuit, comprising:
a first external connection terminal;
a second external connection terminal that is electrically coupled to one end of a resonator;
a third external connection terminal that is electrically coupled to the other end of the resonator;
an amplification circuit that is electrically coupled to the second external connection terminal and the third external connection terminal, amplifies a signal output from the resonator, and supplies the amplified signal to the resonator;
a first node;
a first switching element that switches whether or not to electrically couple the first external connection terminal and the first node;
a second switching element that switches whether or not to electrically couple the first node and the second external connection terminal;
a third switching element that switches whether or not to electrically couple the first external connection terminal and the second external connection terminal,
wherein
the oscillation circuit has
a first mode in which the first switching element does not electrically couple the first external connection terminal and the first node and the second switching element does not electrically couple the first node and the second external connection terminal, and
a second mode in which the first switching element electrically couples the first external connection terminal and the first node and the second switching element electrically couples the first node and the second external connection terminal,
in the first mode, a voltage of the first node is fixed,
in the first mode, the third switching element does not electrically couple the first external connection terminal and the second external connection terminal,
in the second mode, the third switching element electrically couples the first external connection terminal and the second external connection terminal,
each of the first switching element and the second switching element is a P-channel MOS switch, and
the third switching element is an N-channel MOS switch.

12. The oscillation circuit according to claim 11, further comprising:
a fourth external connection terminal to which a first power supply voltage is supplied;
a fifth external connection terminal to which a second power supply voltage higher than the first power supply voltage is supplied; and
a fourth switching element that switches whether or not to electrically couple the first node and the fifth external connection terminal, wherein
in the first mode, the fourth switching element electrically couples the first node and the fifth external connection terminal, in the second mode, the fourth switching element does not electrically couple the first node and the fifth external connection terminal, and the fourth switching element is a P-channel MOS switch.

13. The oscillation circuit according to claim 12 further comprising:

a fifth switching element that switches whether or not to electrically couple the fourth external connection terminal and the third external connection terminal, wherein in the first mode, the fifth switching element does not electrically couple the fourth external connection terminal and the third external connection terminal, and in the second mode, the fifth switching element electrically couples the fourth external connection terminal and the third external connection terminal.

14. The oscillation circuit according to claim 11, wherein in the first mode, the amplification circuit performs an amplification operation for amplifying a signal output from the resonator, and in the second mode, the amplification circuit stops the amplification operation.

15. The oscillation circuit according to claim 11, further comprising:

an interface circuit that selects the first mode or the second mode based on a signal input from the outside of the oscillation circuit.

16. An oscillator comprising:

the oscillation circuit according to claim 11; and the resonator.

* * * * *